United States Patent
Schabes et al.

(10) Patent No.: US 10,032,978 B1
(45) Date of Patent: Jul. 24, 2018

(54) MRAM WITH REDUCED STRAY MAGNETIC FIELDS

(71) Applicant: SPIN TRANSFER TECHNOLOGIES, INC., Fremont, CA (US)

(72) Inventors: Manfred Ernst Schabes, Saratoga, CA (US); Bartlomiej Adam Kardasz, Pleasanton, CA (US); Mustafa Pinarbasi, Morgan Hill, CA (US)

(73) Assignee: SPIN TRANSFER TECHNOLOGIES, INC., Fremont, CA (US)

( * ) Notice: Subject to any disclaimer, the term of this patent is extended or adjusted under 35 U.S.C. 154(b) by 0 days.

(21) Appl. No.: 15/634,629

(22) Filed: Jun. 27, 2017

(51) Int. Cl.
| | |
|---|---|
| *H01L 43/08* | (2006.01) |
| *H01L 43/10* | (2006.01) |
| *H01L 43/02* | (2006.01) |
| *H01L 43/12* | (2006.01) |

(52) U.S. Cl.
CPC .............. *H01L 43/08* (2013.01); *H01L 43/02* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | |
|---|---|---|
| 341,801 A | 5/1886 | Fox |
| 5,541,868 A | 7/1996 | Prinz |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |

(Continued)

FOREIGN PATENT DOCUMENTS

| | | |
|---|---|---|
| CA | 2766141 A1 | 1/2011 |
| CN | 102959693 A | 3/2013 |

(Continued)

OTHER PUBLICATIONS

Boo-Man Seo, et al.; "Current-induced synchronized switching of magnetization;" Applied Physics Letters 101; 2012 American Institute of Physics; Aug. 7, 2012; 6 pages.

(Continued)

*Primary Examiner* — Joseph Schoenholtz
(74) *Attorney, Agent, or Firm* — Arnold & Porter

(57) ABSTRACT

A magnetoresistive random-access memory (MRAM) is disclosed. The MRAM device reduces stray magnetic fields generated by magnetic layers of the stack, including a reference layer and magnetic layers of the synthetic antiferromagnetic layer, in a way that reduces their impact on the other layers of the stack, including a free layer and an optional filter layer, which may include a polarizer layer or a precessional spin current magnetic layer. The reduction in stray magnetic fields in the stack increases the electrical and retention performance of the stack by reducing switching asymmetry in the free layer. The reduction in stray magnetic fields also may improve performance of a filter layer, such as a precessional spin current magnetic layer by reducing asymmetry in the dynamic magnetic rotation of that layer.

34 Claims, 11 Drawing Sheets

(56) References Cited

U.S. PATENT DOCUMENTS

| | | | |
|---|---|---|---|
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,852,760 B2 | 10/2014 | Wang et al. |
| 8,878,317 B2 | 11/2014 | Daibou et al. |
| 8,981,503 B2 * | 3/2015 | Beach .................. G11C 11/161 |
| | | 257/421 |
| 9,025,368 B2 | 5/2015 | Saida et al. |
| 9,082,888 B2 | 7/2015 | Kent et al. |
| 9,117,995 B2 | 8/2015 | Daibou et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |
| 9,362,486 B2 | 6/2016 | Kim et al. |
| 9,406,876 B2 | 8/2016 | Pinarbasi |
| 9,472,748 B2 | 10/2016 | Kuo et al. |
| 9,484,527 B2 | 11/2016 | Han et al. |
| 9,548,445 B2 | 1/2017 | Lee et al. |
| 9,741,926 B1 | 8/2017 | Pinarbasi et al. |
| 9,773,974 B2 | 9/2017 | Pinarbasi et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |

(56) References Cited

U.S. PATENT DOCUMENTS

| | | |
|---|---|---|
| 2006/0227465 A1 | 10/2006 | Inokuchi et al. |
| 2007/0019337 A1 | 1/2007 | Apalkov et al. |
| 2007/0242501 A1 | 10/2007 | Hung et al. |
| 2008/0049488 A1 | 2/2008 | Rizzo |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0328823 A1* | 12/2010 | Chen ............... G01R 33/098 360/324.12 |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0216436 A1 | 9/2011 | Igarashi |
| 2012/0052258 A1 | 3/2012 | Op DeBeeck et al. |
| 2012/0069649 A1 | 3/2012 | Ranjan et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0157385 A1 | 6/2013 | Jung et al. |
| 2013/0240963 A1* | 9/2013 | Beach ............... H01L 43/08 257/295 |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1* | 3/2014 | Beach ............... H01L 29/82 257/421 |
| 2014/0087483 A1 | 3/2014 | Ohsawa |
| 2014/0103472 A1 | 4/2014 | Kent et al. |
| 2014/0145792 A1* | 5/2014 | Wang ............... H01F 10/3272 331/94.1 |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0056368 A1 | 2/2015 | Wang et al. |
| 2015/0171316 A1 | 6/2015 | Park et al. |
| 2015/0255135 A1* | 9/2015 | Tran ............... G11C 11/161 365/158 |
| 2015/0279904 A1 | 10/2015 | Pinarbasi |
| 2015/0287910 A1 | 10/2015 | Lu |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |
| 2016/0181508 A1 | 6/2016 | Lee et al. |
| 2016/0218278 A1 | 7/2016 | Pinarbasi et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0236570 A1* | 8/2017 | Kent ............... G11C 11/161 365/158 |
| 2017/0324029 A1 | 11/2017 | Pinarbasi et al. |
| 2017/0346002 A1 | 11/2017 | Pinarbasi et al. |

FOREIGN PATENT DOCUMENTS

| | | |
|---|---|---|
| CN | 105706259 A | 6/2016 |
| EP | 1345277 A1 | 9/2003 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-524830 A | 7/2008 |
| JP | 2009-027177 A | 2/2009 |
| JP | 2013-012546 A | 1/2013 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017527097 A | 9/2017 |
| JP | 2017532752 A | 11/2017 |
| KR | 10-2014-0115246 A | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2014-062681 | 4/2014 |
| WO | WO-2015-153142 A1 | 10/2015 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO 2016-204835 A1 | 12/2016 |
| WO | WO-2017-019134 A1 | 2/2017 |
| WO | WO-2017-030647 A1 | 2/2017 |
| WO | 2017131894 A1 | 8/2017 |

OTHER PUBLICATIONS

Pinarbasi, et al.; U.S. Appl. No. 14/341,185, filed Jul. 25, 2014, entitled "Method for Manufacturing MTJ Memory Device".

Pinarbasi, et al.; U.S. Appl. No. 14/492,943, filed Sep. 22, 2014, entitled "Magnetic Tunnel Junction Structure for MRAM Device".

(56) References Cited

OTHER PUBLICATIONS

Mustafa Pinarbasi, et al.; U.S. Appl. No. 15/656,398, filed Jul. 21, 2017, entitled "Memory Cell Having Magnetic Tunnel Junction and Thermal Stability Enhancement Layer".
Bartolmiej Adam Kardasz, et al.; U.S. Appl. No. 15/657,498, filed Jul. 24, 2017, entitled "Spin Transfer Torque Structure for MRAM Devices Having a Spin Current Injection Capping Layer".
Notice of Allowance dated Jul. 27, 2017 in U.S. Appl. No. 15/097,576; 22 pages.
Mustafa Pinarbasi, et al.; U.S. Appl. No. 15/674,620, filed Aug. 11, 2017, entitled "Polishing Stop Layer(s) for Processing Arrays of Semiconductor Elements".
Notice of Allowance dated Oct. 16, 2017 in U.S. Appl. No. 14/814,036; 16 pages.
Mustafa Michael Pinarbasi, et al.; U.S. Appl. No. 15/794,871, filed Oct. 26, 2017, entitled "Precessional Spin Current Structure for MRAM".
Michail Tzoufras, et al.; U.S. Appl. No. 15/858,950, filed Dec. 29, 2017, entitled "AC Current Pre-Charge Write-Assist in Orthogonal STT-MRAM".
Marcin Jan Gajek, et al.; U.S. Appl. No. 15/858,988, filed Dec. 29, 2017, entitled "Self-Generating AC current Assist in Orthogonal STT MRAM".
Eric Michael Ryan, et al.; U.S. Appl. No. 15/859,015, filed Dec. 29, 2017, entitled "Shared Oscillator (STNO) for MRAM Array Write-Assist in Orthogonal STT-MRAM".
Michail Tzoufras, et al.; U.S. Appl. No. 15/859,030, filed Dec. 29, 2017, entitled "AC Current Write-Assist in Orthogonal STT-MRAM".
Kadriye Deniz Bozdag, et al.; U.S. Appl. No. 15/859,047, filed Dec. 29, 2017, entitled "Three-Terminal MRAM with AC Write-Assist for Low Read Disturb".
Manfred Ernst Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Manfred Ernst Schabes, et al.; U.S. Appl. No. 15/859,384, filed Dec. 30, 2017, entitled "Perpendicular Magnetic Tunnel Junction Device with Skyrmionic Assist Layers for Free Layer Switching".
Vianfred Ernst Schabes, et al.; U.S. Appl. No. 15/859,381, filed Dec. 30, 2017, entitled "Perpendicular Magnetic Tunnel Junction Device with Precessional Spin Current Layer Having a Modulated Moment Density".
Vianfred Ernst Schabes, et al.; U.S. Appl. No. 15/859,379, filed Dec. 30, 2017, entitled "Perpendicular Magnetic Tunnel Junction Device with Offset Precessional Spin Current Layer".
Manfred Ernst Schabes, et al.; U.S. Appl. No. 15/859,374, filed Dec. 30, 2017, entitled "Switching and Stability Control for Perpendicular Magnetic Tunnel Junction Device".
Mourad El Baraji, et al.; U.S. Appl. No. 15/859,514, filed Dec. 30, 2017, entitled "Microwave Write-Assist in Orthogonal STT-MRAM".
Mourad El Baraji, et al.; U.S. Appl. No. 15/859,517, filed Dec. 30, 2017, entitled "Microwave Write-Assist in Series-Interconnected Orthogonal STT-MRAM Devices".
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.
Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.

Andrew Kent, et al.; U.S. Appl. No. 61/715,111, filed Oct. 17, 2012, entitled "Inverted Orthogonal Spin Transfer Layer Stack".
International Search Report and Written Opinion dated Jul. 10, 2015 in PCT/US2015/021580; 12 pages.
Pinarbasi, et al.; U.S. Appl. No. 14/814,036, filed Jul. 30, 2016, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".
Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
S. Ikeda, et al.; "A perpendicular-anisotropy CoFeB—MgO magnetic tunnel junction"; Nature Materials, vol. 9, Sep. 2010; pp. 721-724; 4 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
NonFinal Office Action dated Jan. 20, 2016 in U.S. Appl. No. 14/242,419; 17 pages.
Final Office Action dated Jul. 9, 2015 in U.S. Appl. No. 14/242,419; 19 pages.
NonFinal Office Action dated Mar. 20, 2015 in U.S. Appl. No. 14/242,419; 18 pages.
NonFinal Office Action dated Sep. 11, 2015 in U.S. Appl. No. 14/492,943; 13 pages.
NonFinal Office Action dated Feb. 6, 2017 in U.S. Appl. No. 14/814,036; 22 pages.
NonFinal Office Action dated Dec. 9, 2017 in U.S. Appl. No. 14/866,359; 26 pages.
NonFinal Office Action dated Jan. 25, 2017 in U.S. Appl. No. 15/097,576; 17 pages.
NonFinal Office Action dated Dec. 23, 2016 in U.S. Appl. No. 15/093,367; 13 pages.
NonFinal Office Action dated Feb. 8, 2017 in U.S. Appl. No. 15/174,482; 10 pages.
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Final Office Action dated Jun. 9, 2017 in U.S. Appl. No. 14/814,038; 19 pages.

\* cited by examiner

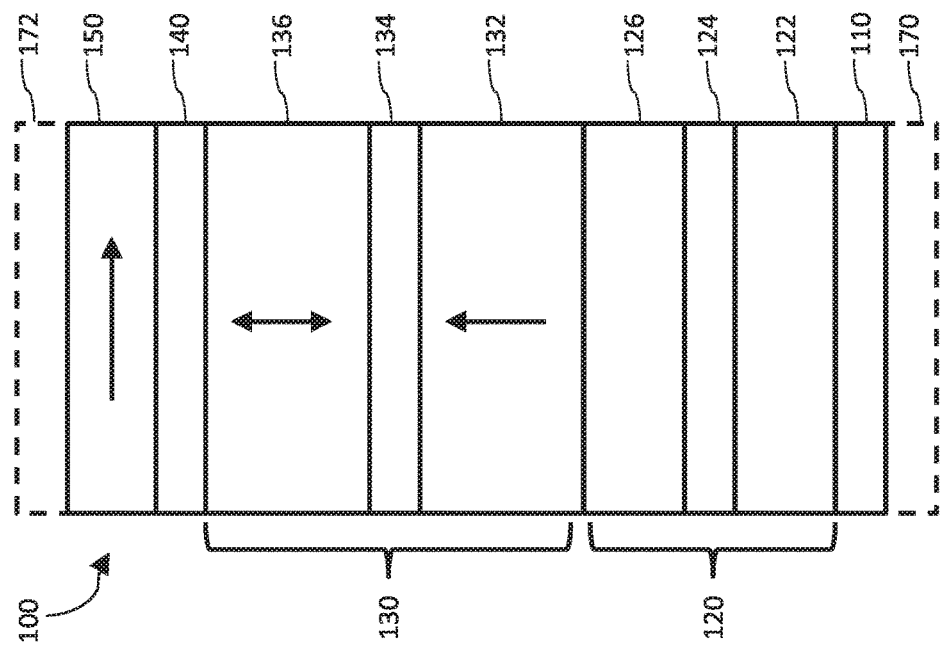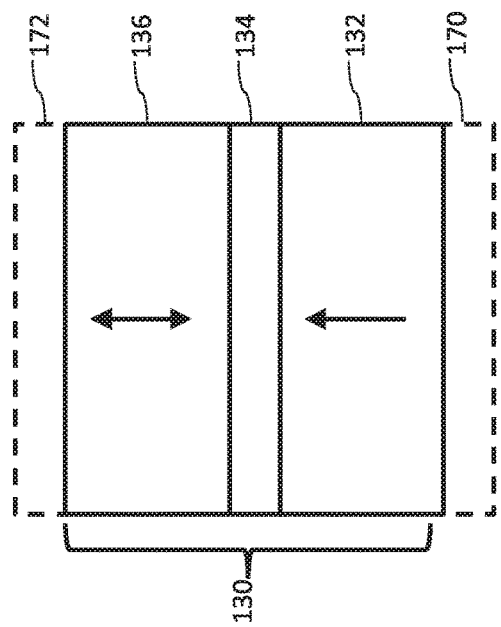

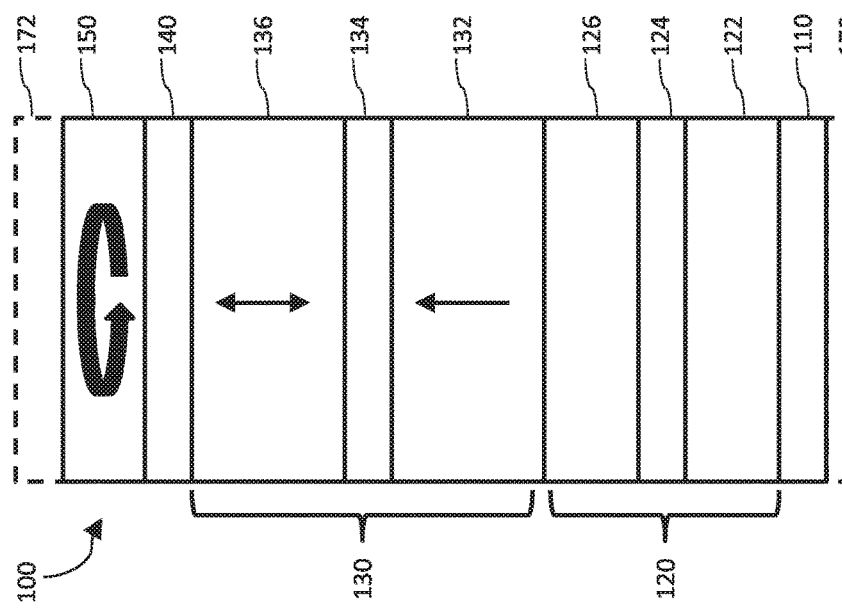

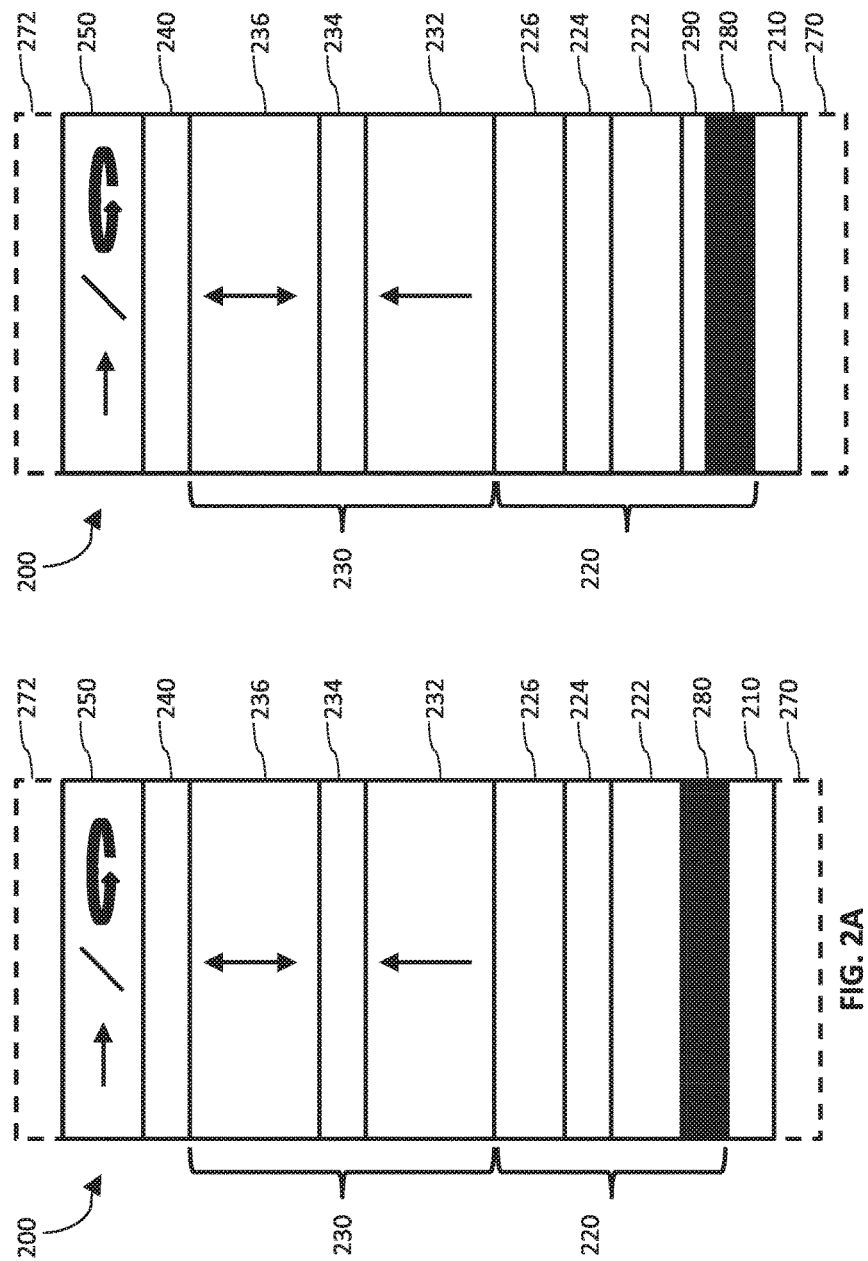

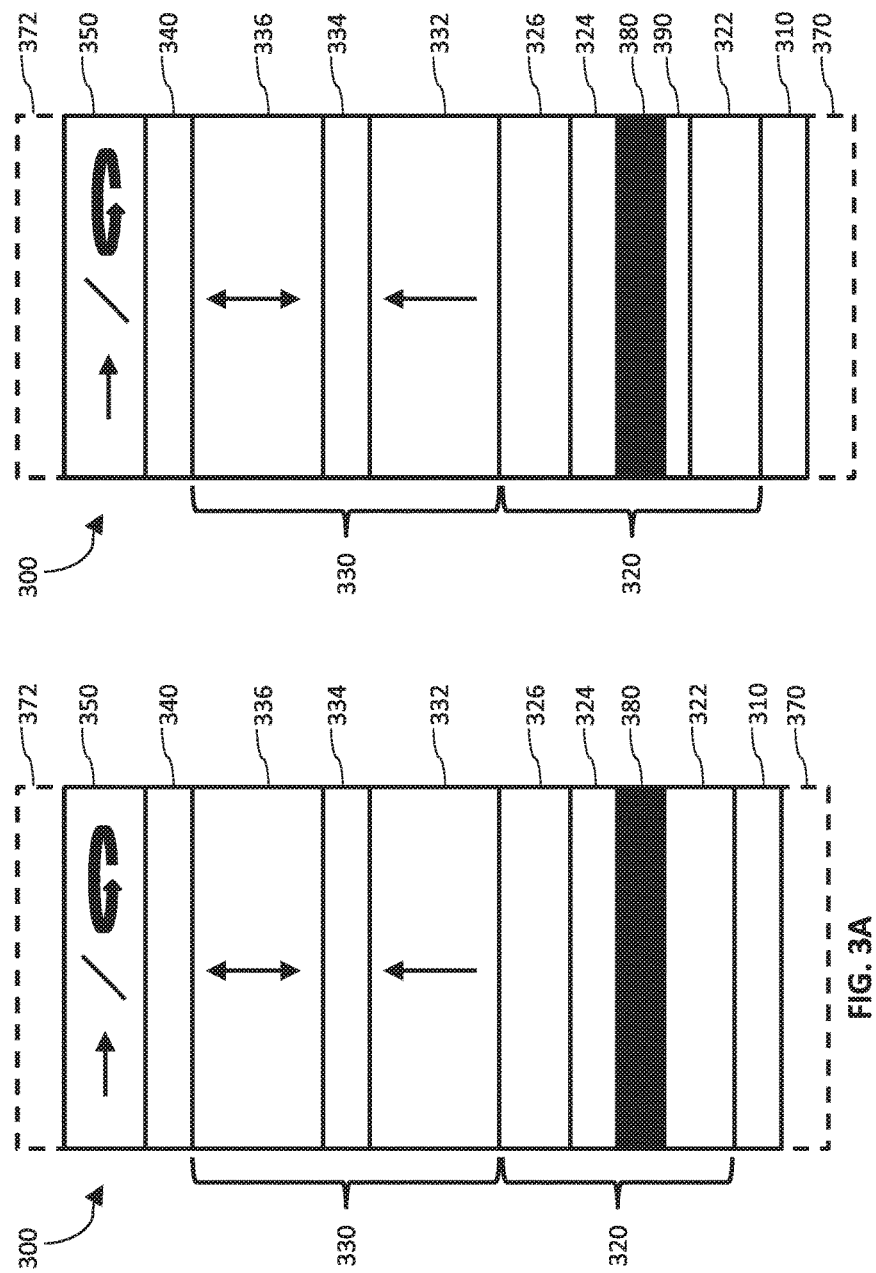

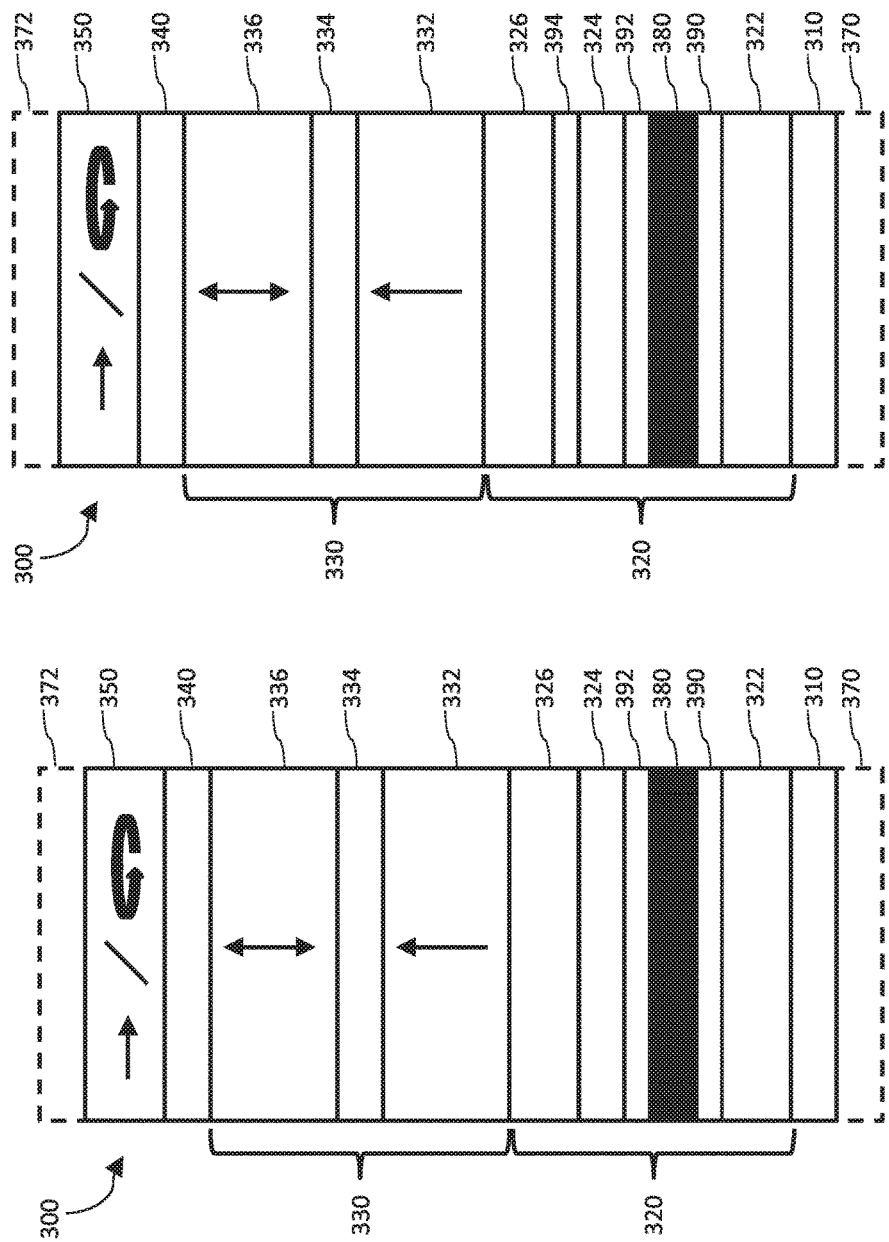

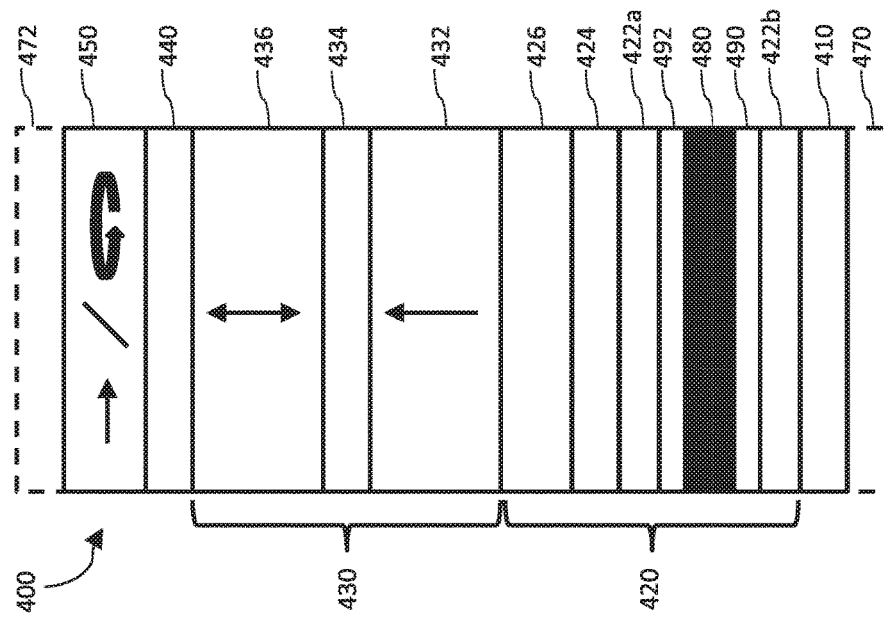
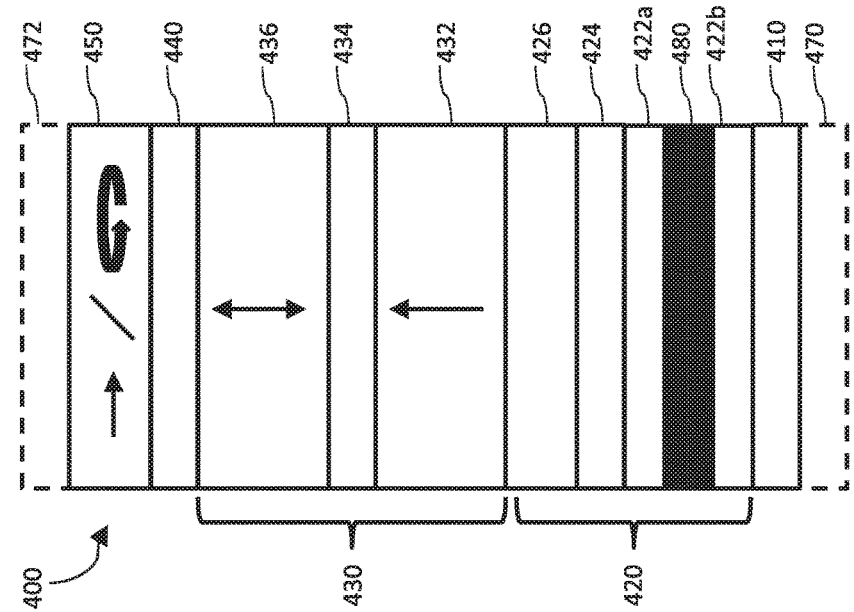

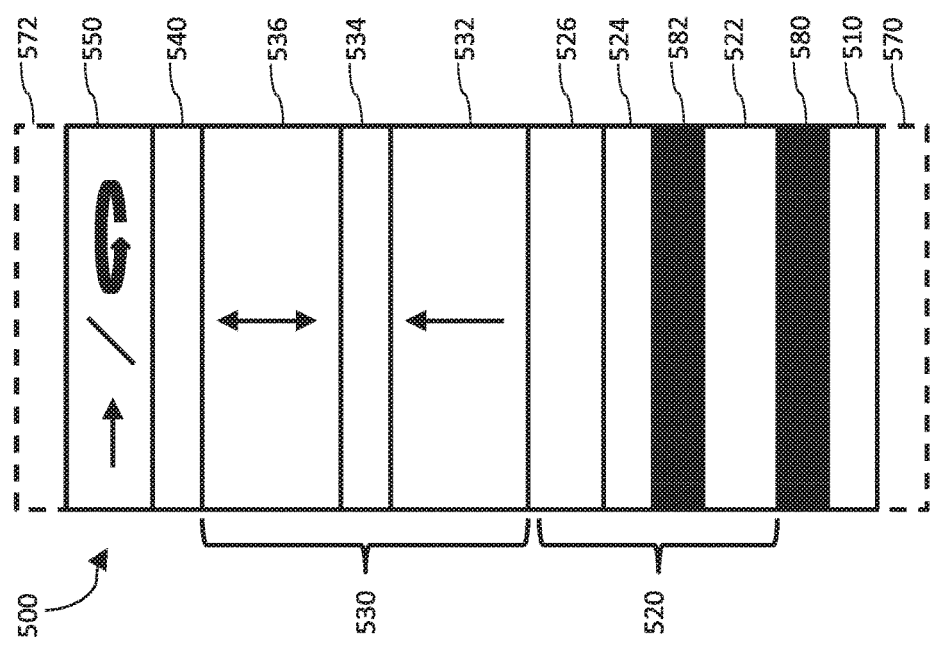

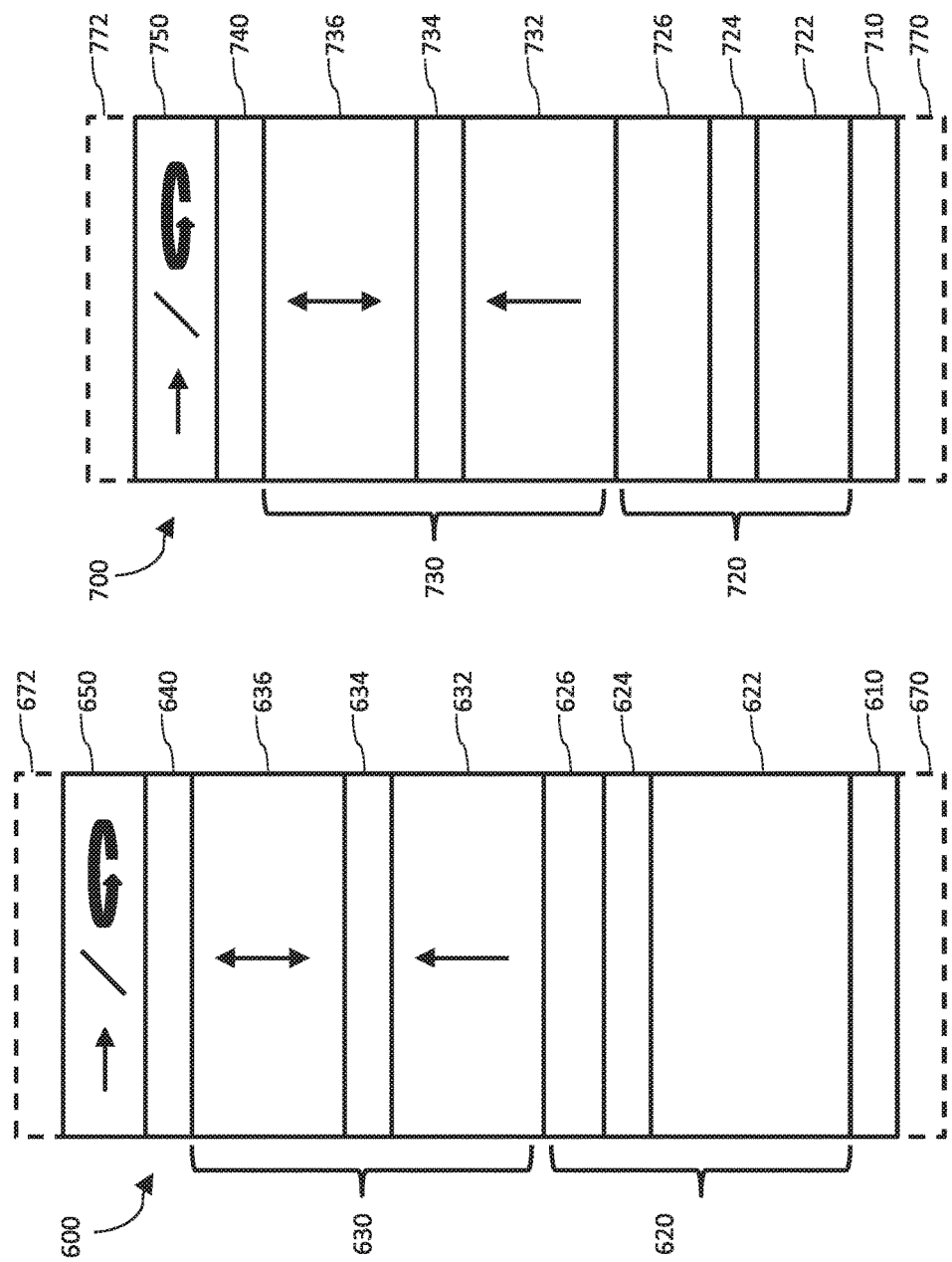

MRAM WITH REDUCED STRAY MAGNETIC FIELDS

FIELD

The present patent document relates generally to magnetic random access memory and, more particularly, to a magnetic tunnel junction stack that reduces stray magnetic fields generated by magnetic layers of the stack, including a reference layer and magnetic layers of the synthetic antiferromagnetic layer, in a way that reduces their impact on the other layers of the stack, including a free layer, and an optional filter layer, which can include a polarizer layer or a precessional spin current magnetic layer. The reduction in stray magnetic fields in the stack increases the electrical and retention performance of the stack by reducing switching asymmetry in the free layer. The reduction in stray magnetic fields also may improve performance of a precessional spin current magnetic layer by reducing asymmetry in the dynamic magnetic rotation of that layer.

BACKGROUND

Magnetoresistive random-access memory ("MRAM") is a non-volatile memory technology that stores data through magnetic storage elements. These elements are two ferromagnetic plates or electrodes that can hold magnetization and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetization of the two layers. The cell's resistance will be different for the parallel and anti-parallel states and thus the cell's resistance can be used to distinguish between a "1" and a "0." One important feature of MRAM devices is that they are non-volatile memory devices, since they maintain the information even when the power is off. The two plates can be sub-micron in lateral size and the magnetization direction can still be stable with respect to thermal fluctuations.

FIG. 1A illustrates a magnetic tunnel junction ("MTJ") 130 for a conventional MRAM device. The MTJ 130 includes reference layer 132, which is a magnetic layer, a non-magnetic tunneling barrier layer 134, which generally is an insulator at large layer thickness but at small layer thickness admits the flow of an appreciable quantum mechanical tunnel current, and a free layer 136, which is also a magnetic layer. The magnetization direction of the magnetic layers of the MTJ 130 can either be in the planes of those layers or perpendicular to the planes of those layers. As shown in FIG. 1, the magnetic reference layer 132 has a magnetization direction perpendicular to its plane. Also as seen in FIG. 1, the free layer 136 also has a magnetization direction perpendicular to its plane, but its direction can vary by 180 degrees. Because the magnetization direction of the magnetic layers of the MTJ 130 is perpendicular to the planes of those layers, the MTJ 130 shown in FIG. 1A is known as a perpendicular MTJ.

As shown in FIG. 1A, electrical contact layers 170, 172 can optionally be used to provide electrical contact to the MTJ 130. When the magnetization of the free layer 136 is oriented in a direction parallel to the magnetization direction of the reference layer 132, electrons will be more likely to tunnel across the tunneling barrier layer 134, and thus resistance across the MTJ 130 will be lower. Alternatively, when the magnetization of the free layer 136 is oriented in a direction that is anti-parallel to the magnetization direction of the reference layer 132, electrons will be less likely to tunnel across the tunneling barrier layer 134, making the resistance across the MTJ 130 significantly higher. It is these different resistances that can be used to distinguish and store a digital "1" or "0" bit.

The MTJ 130 may also form part of a larger MTJ stack 100, as shown in FIG. 1B, which may include a number of other optional layers that can be used to facilitate operation of the MTJ. As described in connection with FIG. 1A, the MTJ stack 100 of FIG. 1B may include electrical contact layers 170, 172 for providing electrical contact across the MTJ stack 100, including the MTJ 130. The MTJ 130 may be disposed above an antiferromagnetic layer or a synthetic antiferromagnetic ("SAF") structure 120, which may include multiple layers as shown in FIG. 1B. For example, as shown in FIG. 1B, the SAF structure 120 may include two or more thin magnetic layers, including a lower "SAF1" layer 122 and an upper "SAF2" layer 126 having opposite or anti-parallel magnetization directions separated by an anti-ferromagnetic coupling layer 124 or spacer layer that is not magnetic. The SAF structure 120 also may be formed over a seed layer 110, as shown in FIG. 1B, and over a substrate (not shown). Note that as used herein, terms such as "lower," "upper," "top," "bottom," and the like are provided for convenience in explaining the various embodiments, and are not limiting in any way.

Spin transfer torque or spin transfer switching, may be used in connection with an MTJ 130. In such a configuration, a filter layer 150 may be used to alter the spin of electrons passing through the MTJ 130. For example, the filter layer may be a polarizer layer designed to further align the spin of electrons (i.e., to further "polarize" the electrons) passing through the MTJ 130 beyond the alignment already provided by the reference layer 132. U.S. patent application Ser. No. 14/814,036, filed by Pinarbasi et al., and assigned to the assignee of this patent document describe using a polarizer layer. The disclosure of U.S. patent application Ser. No. 14/814,036 is incorporated herein by reference in its entirety. The spin-aligned or "polarized" electrons are used to change the magnetization orientation of the free layer 136 in the MTJ 130. In general, electrons possess a spin, a quantized number of angular momentum intrinsic to the electron. An electrical current is generally unpolarized, i.e., it consists of 50% spin up and 50% spin down electrons. Passing a current though a magnetic layer, like the filter layer 150 or the reference layer 132, polarizes electrons with the spin orientation corresponding to the magnetization direction of the magnetic layer, thus producing a spin-polarized current. If a spin-polarized current is passed to the magnetic region of a free layer 136 of the MTJ 130, the electrons will transfer a portion of their spin-angular momentum to the magnetization layer to produce a torque on the magnetization of the free layer. Thus, this spin transfer torque can switch the magnetization of the free layer, which can be used to write either a "1" or a "0" based on whether the free layer 136 is in the parallel or antiparallel states relative to the reference layer.

As shown in FIG. 1B, the filter layer 150 and a nonmagnetic filter coupling layer 140 or "spacer" are disposed above the free layer 136 of the MTJ 130. The filter layer 150 is a magnetic layer that has a magnetic direction in its plane, but is perpendicular to the magnetic direction of the reference layer 132 and free layer 136. In addition to the polarizing effects from the reference layer 132, a polarizer layer can be used as the filter layer 150 to polarize a current of electrons ("spin-aligned electrons") applied to MTJ structure 100 in the manner described above.

As shown in FIG. 1C, the MTJ stack 100 can also use a precessional spin current magnetic layer instead as a filter layer 150. The precessional spin current magnetic layer is described in detail in U.S. patent application Ser. No. 14/814,036, filed by Pinarbasi et al., and assigned to the assignee of this patent document. In such an MRAM device, a precessional spin current magnetic layer is physically separated from the free magnetic layer of a magnetic tunnel junction and is coupled to the free magnetic layer by a non-magnetic spacer 140. Additionally, a precessional spin current structure for MRAM is described in U.S. patent application Ser. Nos. 15/445,260 and 15/445,362, both of which are filed by Pinbarsi et al. and are assigned to the assignee of this document. The disclosure of U.S. patent application Ser. Nos. 15/445,260 and 15/445,362 are both incorporated herein by reference in their entirety.

The magnetic layers of the MTJ stack 100 shown in FIG. 1, such as the reference layer 132 and the magnetic layers 122, 126 of the SAF structure 120, generally emit stray magnetic fields as part of their normal operation. The stray fields emitted by these magnetic layers can interfere with and degrade the performance of other layers of the MTJ stack 100. For example, stray fields from magnetic layers of the MTJ stack 100 can impinge on and degrade the performance of the free layer 136, because they cause an asymmetry in the switching of the magnetization direction of the free layer 136. In other words, these stray magnetic fields can make it easier to align the magnetization direction of the free layer in one direction than in the other direction. This can result in the need for a larger current to switch the magnetization direction of the free layer 136 in the more difficult direction. Such an asymmetry can also be characterized as an offset of the center of an M-H hysteresis loop of the MTJ 130 (i.e., the hysteresis observed when measuring the magnetization or "M" and the magnetic field "H" of the MTJ using a magnetometer). The asymmetry of the switching current in such situations can result in added costs and increased design requirements for the corresponding electronic circuitry. It also can be detrimental to the memory retention time, because of the reduced energy barrier against thermal reversal in one of the two storage states. Additionally, the asymmetry of switching current generally can be deleterious to the error rate performance of the MTJ 130 and any memory device in which it is used.

The stray magnetic fields of the magnetic layers of the MTJ stack 100, such as the reference layer 132 and the magnetic layers 122, 126 of the SAF structure 120, can also impinge on and degrade the performance of a filter layer 150, such as a polarizer layer or a precessional spin current magnetic layer, when such a layer is used. In particular, the stray magnetic fields can negatively affect the performance of a precessional spin current magnetic layer used as a filter layer 150 because they introduce an asymmetry in the dynamic magnetic rotation of that layer. This asymmetry results in a performance degradation and potential increased costs in the device.

The negative effects of the stray magnetic fields are more pronounced as the magnetic layers emitting those fields become closer to the layers that they are affecting. In addition, it can be expected that this effect will become increasingly pronounced as the lateral size (e.g., the diameter) of the MTJ 130 decreases. Also, as layers of the SAF structure 120 or the reference layer 132 get closer to the free layer 136 or the filter layer 150, the stray magnetic fields have more of an impact on the free layer 136 and the filter layer 150. As a consequence, it is desirable to reduce the negative effects of these stray fields.

Prior approaches to reducing stray magnetic fields have included changing the magnetic moment of one or more layers of the SAF structure 120 and the reference layer 132 by changing the magnetic volume of those layers. But this can cause undesirable effects. For example, increasing the magnetic volume of the reference layer 132 can reduce that layer's perpendicular anisotropy, which leads to degraded performance of the MTJ 130 device. Additionally, increasing the magnetic volume of the reference layer 132 can also reduce the pinning of the reference layer 132 to one or more of the layers of the SAF structure 120, which could cause the MTJ 130 device to perform poorly and can reduce the stability of the reference layer 132.

SUMMARY

An MRAM device is disclosed that has a magnetic tunnel junction stack that reduces stray magnetic fields generated by magnetic layers of the stack, including a reference layer and magnetic layers of the synthetic antiferromagnetic layer, in a way that reduces their impact on the other layers of the stack, including a free layer and an optional filter layer, and which can comprise a polarizer layer or a precessional spin current magnetic layer. The reduction in stray magnetic fields in the stack improves the electrical performance of the stack by reducing switching asymmetry in the free layer. The reduction in stray magnetic fields also may improve performance of a precessional spin current magnetic layer, when incorporated as filter layer, by reducing asymmetry in the dynamic magnetic rotation of that layer.

In an embodiment, a magnetic device includes a first synthetic antiferromagnetic structure in a first plane having a magnetization vector that is perpendicular to the first plane and having a fixed magnetization direction. An embodiment also includes an antiferromagnetic coupling layer in a second plane and disposed above the first synthetic antiferromagnetic structure and a second synthetic antiferromagnetic structure in a third plane and disposed over the antiferromagnetic coupling layer. An embodiment further includes a magnetic reference layer in a fourth plane and disposed over the second synthetic antiferromagnetic structure. The magnetic reference layer has a magnetization vector that is perpendicular to the fourth plane and having a fixed magnetization direction. (For the purposes of this patent document, angles within several degrees of perpendicular are within the scope of what is considered perpendicular.) An embodiment further includes a non-magnetic tunnel barrier layer in a fifth plane and disposed over the magnetic reference layer. An embodiment also includes a free magnetic layer in a sixth plane and disposed over the non-magnetic tunnel barrier layer. The free magnetic layer has a magnetization vector that is perpendicular to the sixth plane and has a magnetization direction that can switch between a first magnetization direction to a second magnetization direction. The magnetic reference layer, the non-magnetic tunnel barrier layer and the free magnetic layer form a magnetic tunnel junction. An embodiment also includes an auxiliary layer in a seventh plane that adjusts the magnetic-moment imbalance between the first synthetic antiferromagnetic structure and the magnetic reference layer to reduce stray magnetic fields in the free magnetic layer.

In an embodiment, the magnetic device further includes an auxiliary exchange coupling layer in an eighth plane and disposed between the auxiliary layer and the first synthetic antiferromagnetic structure. The auxiliary exchange coupling layer is formed from a ferromagnetic material and increases the ferromagnetic coupling between the auxiliary layer and the first synthetic antiferromagnetic structure.

In an embodiment of the magnetic device, the auxiliary exchange coupling layer is made from material including an element from the group of: Fe, Co, and Ni.

In an embodiment of the magnetic device, the auxiliary exchange coupling layer is made from material including an element from the group of: Ta, Cr, W, Ti, and Ru.

In an embodiment of the magnetic device, the auxiliary exchange coupling layer has a thickness within the range of 0.3 nm to 1.0 nm, inclusive.

In an embodiment, the magnetic device also includes a second auxiliary exchange coupling layer in a ninth plane and disposed between the first synthetic antiferromagnetic structure and the second synthetic antiferromagnetic structure. The second auxiliary exchange coupling layer increases the antiferromagnetic coupling between the first synthetic antiferromagnetic structure and the second synthetic antiferromagnetic structure.

In an embodiment, the magnetic device also includes a third auxiliary exchange coupling layer in a tenth plane and disposed between the second synthetic antiferromagnetic structure and the antiferromagnetic coupling layer. The third auxiliary exchange coupling layer further increases the antiferromagnetic coupling between the first synthetic antiferromagnetic structure and the second synthetic antiferromagnetic structure.

In an embodiment of the magnetic device, the auxiliary layer is formed from $Co_xFe_yB_z$, where y is in the range 40-60%, z is in the range 18-21%, and x+y+z=100%.

In an embodiment of the magnetic device, the auxiliary layer is formed from $Co_{40}Fe_{40}B_{20}$.

In an embodiment of the magnetic device, the auxiliary layer has a thickness within the range of 0.5 nm to 7.0 nm, inclusive.

In an embodiment, the magnetic device also includes a filter layer in an eighth plane that is physically separated from the free magnetic layer and coupled to the free magnetic layer by a filter coupling layer that may induce ferromagnetic or antiferromagnetic coupling between the free magnetic layer and the filter layer.

In an embodiment, the filter layer is selected from the group that of: a polarizer layer and a precessional spin current magnetic layer.

In an embodiment, the magnetic device also includes a first electrode disposed beneath and connected to the first synthetic antiferromagnetic structure, and a second electrode disposed above the polarizing layer. Electrical current is directed through the filter layer, the filter coupling layer, the free magnetic layer, the non-magnetic tunnel barrier layer, the magnetic reference layer, and the synthetic antiferromagnetic structures In an embodiment, alignment of the electrons of the electrical current is further increased by the filter layer.

In an embodiment, the filter layer is a precessional spin current magnetic layer. The precessional spin current magnetic layer has a magnetization vector with a magnetization component in the eighth plane which can freely rotate in any magnetic direction.

In an embodiment, the magnetic device also includes a first electrode disposed beneath and connected to the first synthetic antiferromagnetic structure. In an embodiment, the magnetic device also includes a second electrode disposed above the precessional spin current magnetic layer. In an embodiment, electrical current is directed through the precessional spin current magnetic layer, the antiferromagnetic coupling layer, the free magnetic layer, the non-magnetic tunnel barrier layer, the magnetic reference layer, wherein electrons of the electrical current are polarized In an embodiment of the magnetic device, the magnetization direction of the precessional spin current magnetic layer is free to follow the precession of the magnetization direction of the free magnetic layer in a correlated or anticorrelated way. This causes spin transfer torque to assist switching of the magnetization vector of the free magnetic layer.

In an embodiment, the magnetic device also includes a spin-filter-coupling layer in a ninth plane and disposed between the precessional spin current magnetic layer and the free magnetic layer. The spin-filter-coupling layer couples the precessional spin current magnetic layer and the free magnetic layer.

In an embodiment of the magnetic device, the auxiliary layer is disposed below the first synthetic antiferromagnetic structure. The auxiliary layer is formed from a material having a high magnetic-moment density.

In an embodiment of the magnetic device, the auxiliary layer is disposed above the first synthetic antiferromagnetic structure and below the antiferromagnetic coupling layer. The auxiliary layer is formed from a material having a high magnetic-moment density.

In an embodiment of the magnetic device, the auxiliary layer includes an auxiliary layer disposed parallel to and within the first synthetic antiferromagnetic structure. The auxiliary layer is formed below a top portion of the first synthetic antiferromagnetic structure and above a bottom portion of the first synthetic antiferromagnetic structure. The auxiliary layer is formed from a material having a high magnetic-moment density.

In an embodiment of the magnetic device, the auxiliary layer has a thickness of 6 nm.

In an embodiment of the magnetic device, the auxiliary layer has a thickness of equal to the sum total of the thicknesses of the top portion of the first synthetic antiferromagnetic structure and the bottom portion of the first synthetic antiferromagnetic structure.

In an embodiment of the magnetic device, the top portion of the first synthetic antiferromagnetic structure has a thickness between 1 nm and 5 nm.

In an embodiment of the magnetic device, the top portion of the first synthetic antiferromagnetic structure has a thickness of 3 nm.

In an embodiment of the magnetic device, the bottom portion of the first synthetic antiferromagnetic structure has a thickness between 1 nm and 20 nm.

In an embodiment of the magnetic device, the bottom portion of the first synthetic antiferromagnetic structure has a thickness of 3 nm.

In an embodiment of the magnetic device, the top portion of the first synthetic antiferromagnetic structure has a thickness equal to the bottom portion of the first synthetic antiferromagnetic structure.

In an embodiment of the magnetic device, the bottom portion of the first synthetic antiferromagnetic structure has a thickness that is twice the thickness of the top portion of the first synthetic antiferromagnetic structure.

In an embodiment, a magnetic device includes a first synthetic antiferromagnetic structure in a first plane having a magnetization vector that is perpendicular to the first plane and having a fixed magnetization direction. An embodiment also includes an antiferromagnetic coupling layer in a second plane and disposed over the first synthetic antiferromagnetic structure. An embodiment also includes a second synthetic antiferromagnetic structure in a third plane and disposed over the antiferromagnetic coupling layer. An embodiment also includes a magnetic reference layer in a fourth plane and disposed over the second synthetic antiferromagnetic structure. The magnetic reference layer has a magnetization vector that is perpendicular to the fourth plane and having a fixed magnetization direction. An embodiment also includes a non-magnetic tunnel barrier layer in a fifth plane and disposed over the magnetic reference layer. An embodiment also includes a free magnetic layer in a sixth plane and disposed over the non-magnetic tunnel barrier layer. The free magnetic layer has a magnetization vector that is perpendicular to the sixth plane and having a magnetization direction that can switch between a first magnetization direction to a second magnetization direction. The magnetic reference layer, the non-magnetic tunnel barrier layer and the free magnetic layer form a magnetic tunnel junction. According to an embodiment, the thickness of the first synthetic antiferromagnetic structure is greater than the thickness of the second synthetic antiferromagnetic structure and the magnetic-moment density of the first synthetic antiferromagnetic structure is the same as the magnetic-moment density of the second synthetic antiferromagnetic structure.

In an embodiment of the magnetic device, the thickness of the first synthetic antiferromagnetic structure has a thickness within the range of 6 nm to 20 nm, inclusive.

In an embodiment of the magnetic device, the thickness of the first synthetic antiferromagnetic structure has a thickness within the range of 2 nm to 6 nm, inclusive.

In an embodiment, a magnetic device includes a first synthetic antiferromagnetic structure in a first plane having a magnetization vector that is perpendicular to the first plane and having a fixed magnetization direction. An embodiment also includes an antiferromagnetic coupling layer in a second plane and disposed over the first synthetic antiferromagnetic structure. An embodiment also includes a second synthetic antiferromagnetic structure in a third plane and disposed over the antiferromagnetic coupling layer. An embodiment also includes a magnetic reference layer in a fourth plane and disposed over the second synthetic antiferromagnetic structure. The magnetic reference layer has a magnetization vector that is perpendicular to the fourth plane and having a fixed magnetization direction. An embodiment also includes a non-magnetic tunnel barrier layer in a fifth plane and disposed over the magnetic reference layer. An embodiment also includes a free magnetic layer in a sixth plane and disposed over the non-magnetic tunnel barrier layer. The free magnetic layer has a magnetization vector that is perpendicular to the sixth plane and having a magnetization direction that can switch between a first magnetization direction to a second magnetization direction. The magnetic reference layer, the non-magnetic tunnel barrier layer and the free magnetic layer form a magnetic tunnel junction. According to an embodiment, the thickness of the first synthetic antiferromagnetic structure and the thickness of the second synthetic antiferromagnetic structure are the same, and the magnetic-moment density of the first synthetic antiferromagnetic structure is greater than the magnetic-moment density of the second synthetic antiferromagnetic structure.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 1A illustrates a conventional MTJ capable of use in an MRAM device.

FIGS. 1B-1C illustrate a conventional MTJ stack for an MRAM device.

FIG. 2A illustrates an MTJ stack for an MRAM device with an auxiliary layer.

FIG. 2B illustrates an MTJ stack for an MRAM device with an auxiliary layer and an auxiliary exchange coupling layer.

FIG. 3A illustrates an MTJ stack for an MRAM device with an auxiliary layer.

FIG. 3B illustrates an MTJ stack for an MRAM device with an auxiliary layer and an auxiliary exchange coupling layer.

FIG. 3C illustrates an MTJ stack for an MRAM device with an auxiliary layer and auxiliary exchange coupling layers.

FIG. 3D illustrates an MTJ stack for an MRAM device with an auxiliary layer and auxiliary exchange coupling layers.

FIG. 4A illustrates an MTJ stack for an MRAM device with an auxiliary layer.

FIG. 4B illustrates an MTJ stack for an MRAM device with an auxiliary layer and auxiliary exchange coupling layers.

FIG. 5 illustrates an MTJ stack for an MRAM device with auxiliary layers.

FIG. 6 illustrates an MTJ stack for an MRAM device with a modified SAF structure.

FIG. 7 illustrates an MTJ stack for an MRAM device with a modified SAF structure.

Figure 8A:
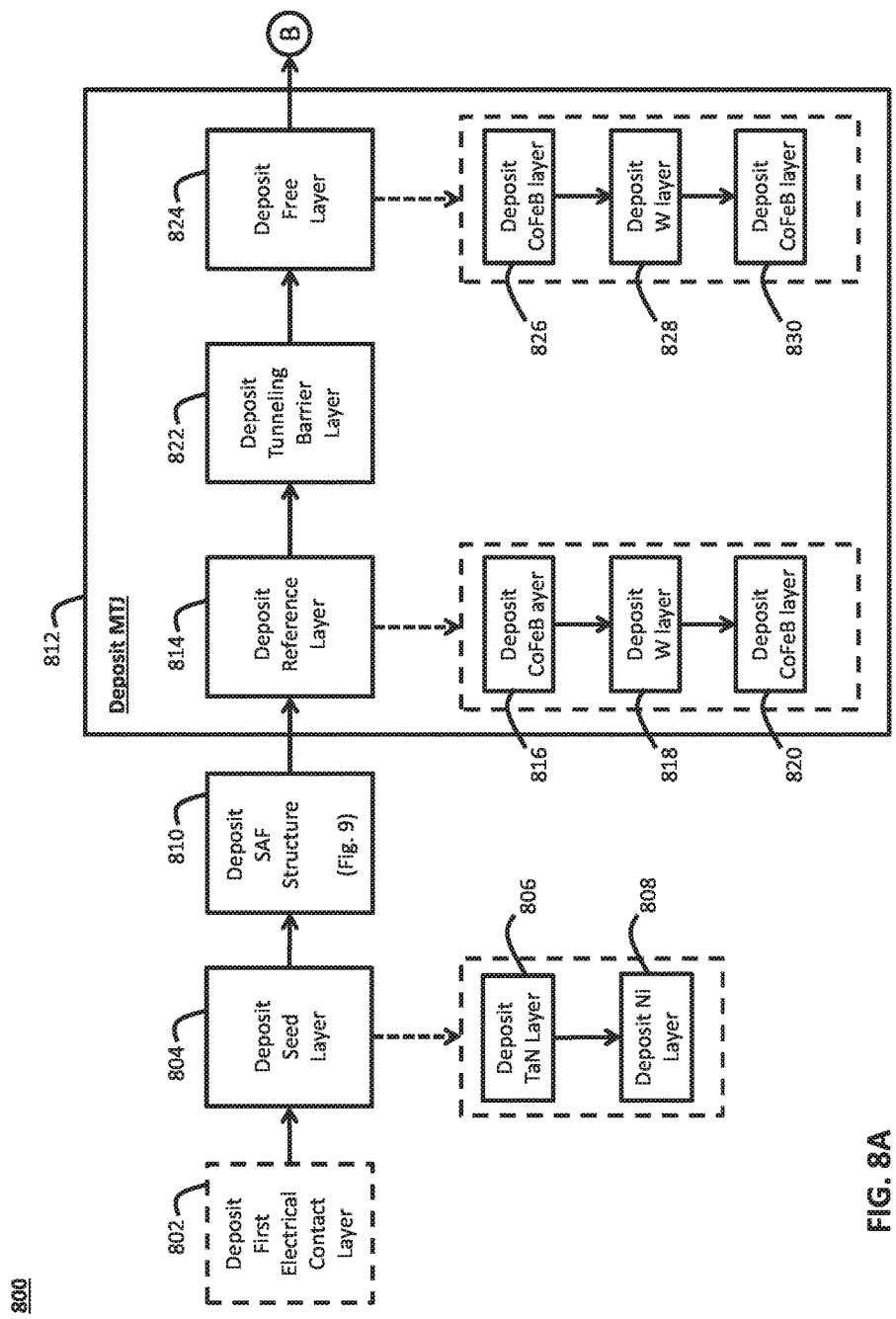
FIGS. 8A-8B illustrates flow charts showing manufacturing steps for an MRAM device having reduced stray magnetic fields.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a magnetic tunnel junction stack that reduces stray magnetic fields generated by magnetic layers of the stack. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

This patent document discloses a magnetic tunnel junction stack that reduces stray magnetic fields generated by magnetic layers of the stack in a way that reduces their impact on the other layers of the stack. For example, the present patent document discloses reducing stray magnetic fields from a reference layer of a magnetic tunnel junction stack that may negatively impact a free layer of the stack. Additionally, the present patent document discloses reducing stray magnetic fields from magnetic layers of the synthetic antiferromagnetic layer that may impact the free layer of the stack. By reducing stray magnetic fields in the stack, switching asymmetry in the free layer can be reduced and the electrical performance of the stack can be increased. In addition, the present patent document discloses reducing the impact of stray magnetic fields from magnetic layers such as the reference layer or the magnetic layers of the synthetic antiferromagnetic layer, that impact an optional filter layer, such as a polarizer layer or a precessional spin current magnetic layer, of the stack, where such a layer is used. The reduction in stray magnetic fields can improve performance of a filter layer, such as a polarizer layer or precessional spin current magnetic layer, by reducing asymmetry in the dynamic magnetic rotation of that layer.

According to embodiments, an auxiliary layer can be added to an MTJ stack to reduce the stray magnetic fields in the stack that may have undesirable effects on the free layer of the stack, or on a filter layer of the stack when used. To reduce the impact of stray magnetic fields on the free layer, the auxiliary layer can be used to tune the magnetic-moment imbalance between one or more magnetic layers in the SAF structure of the stack, and the reference layer of the stack. The location, size, and configuration of the auxiliary layer varies according to embodiments. An auxiliary layer in embodiments may be used with one or more auxiliary exchange coupling layers that improve the coupling of the auxiliary layer to other layers of the MTJ stack.

FIG. 2A shows an MTJ stack 200 that includes an auxiliary layer 280 below the lower SAF1 layer 222 of the SAF structure 220. The MTJ stack 200 can be used as an MRAM device. The MTJ stack 200 includes an MTJ 230, which includes a magnetic reference layer 232, a non-magnetic tunneling barrier layer 234, and a magnetic free layer 236. The magnetic reference layer 232 has a magnetization direction perpendicular to its plane, and the free layer 236 also has a magnetization direction perpendicular to its plane, but as shown in FIG. 2A, its direction can vary by 180 degrees. The differences in resistance based on whether the magnetization direction of the free layer 236 is parallel to or anti-parallel to the magnetization direction of the reference layer 232 can be used to distinguish and store a digital "1" or "0" bit. The non-magnetic tunneling barrier layer 234 may be formed from MgO, or other suitable material. In embodiments where MgO is used to form the tunneling barrier layer 234, that material may have a crystalline texture that is a (001) texture.

The MTJ stack 200 may also include a number of other optional layers that can be used to facilitate operation of the MTJ 230. For example, the MTJ stack 200 may include electrical contact layers 270, 272 for providing electrical contact across the MTJ stack 200. According to an embodiment, the electrical contact layers 270, 272 may be electrodes for providing a voltage across the MTJ stack 200, and may be formed from any suitable conducting material. The MTJ 230 also can be disposed above an SAF structure 220, which may include multiple sub-layers and structures as shown in FIG. 2A. For example, as shown in FIG. 2A, the SAF structure 220 may include two or more thin magnetic layers, such as a lower "SAF1" layer 222 and an upper "SAF2" layer 226, having opposite or anti-parallel magnetization directions separated by an antiferromagnetic coupling layer 224 (or "spacer" layer) that is not magnetic. The SAF structure 220 also may be formed over a seed layer 210 and over a substrate (not shown). In general, in each of the MTJ stacks described herein, the lower SAF1 layer of the MTJ can be formed on a seed layer, as shown in FIG. 2A and the other figures using similar numbering, and all layers can be formed on a substrate (not shown in the figures). Magnetic layers of the stack 200, such as reference layer 232, the free layer 236, and the magnetic SAF layers 222, 226, may be made from a variety of materials, including Co, Ni, Fe, or alloys of those elements. In addition, magnetic layers of the stack 200 may be made from alloys of magnetic elements with non-magnetic elements, such as B, Ta, W, Pt, and Pd. Additionally, magnetic layers of the stack 200 may also be made using multiple layers of magnetic elements or alloys and non-magnetic elements such as Pt and Pd, including, for example, CoPt or CoPd multi-layers. The antiferromagnetic coupling layer 224 may be made from materials such as Ru or Cr, or other materials suitable to induce anti-parallel alignment between the lower SAF1 layer 222 and the upper SAF2 layer 226.

A filter layer 250 may optionally be used for facilitating spin transfer torque switching between states. As depicted in FIG. 2A, the optional filter layer 250 may comprise a polarizer layer or a precessional spin current magnetic layer, or both. Incorporating an optional filter layer 250, including a polarizer layer, a precessional spin current magnetic layer, or a combination of the two will enhance the alignment of the spin of electrons passing through the MTJ 230. In such a situation, the optional filter layer 250 and a nonmagnetic filter coupling layer 240 are disposed above the free layer 236 of the MTJ 230. The filter layer 250 may be made from materials such as $Co_xFe_yB_z$, which contains x-percent Co, y-percent Fe and z-percent B, where y is in the range 40-60%, z is in the range 18-21%, and x+y+z=100%. For example, according to an embodiment, the filter layer 250 may be made from $Co_{40}Fe_{40}B_{20}$. The filter coupling layer 240 can be made of MgO, Cr, Ta, TaN, or other suitable materials to permit it to align the spin of electrons passing through the MTJ 230.

The thickness of the layers of the MTJ stack 200 can vary, and can be adjusted to produce the appropriate or desired electrical performance. Examples of thickness that may be used in certain circumstances are provided. It will be understood by those skilled in the art that these numbers can be adjusted or scaled consistent with the principles described herein. By way of example, the reference layer 232 may have a thickness in the range of 0.5 nanometers ("nm") to 3.0 nm, the free layer 236 may have a thickness in the range of 0.6 nm to 3.0 nm, and the tunnel barrier layer 234 may have a thickness in the range of 0.3 nm to 1.5 nm. By way of example, the lower and upper SAF layers 222, 226 may have a thickness in the range of 2 nm to 20 nm, and the antiferromagnetic coupling layer 224 may have a thickness in the range of 0.5 nm to 1.2 nm. For example, according to embodiments, the SAF layers 222, 226 can have a thickness of 6 nm. In embodiments where the optional filter layer 250 and filter coupling layer 240 are used, the filter layer 250 may have a thickness in the range from 0.5 nm to 2.5 nm and the filter coupling layer may have a thickness in the range from 0.2 nm to 1.5 nm.

To reduce the stray magnetic fields generated by the reference layer 232 or magnetic layers of the SAF structure 220 (e.g., the lower SAF1 layer 222), an auxiliary layer 280 may be added to the MTJ stack 200. An auxiliary layer may be added to the stack 200 in a number of different locations. In the configuration shown in FIG. 2A, the auxiliary layer 280 is added below and directly in contact with the lower SAF1 layer 222 of the SAF structure 220. In other words, the lower SAF1 layer 222 is formed directly on the auxiliary layer 280, such that the auxiliary layer forms a bottom capping layer of the SAF structure 220.

To reduce stray fields in the MTJ stack 200, the auxiliary layer 280 may be formed from a material that has a high magnetic moment density. For example, the auxiliary layer 280 may be formed using a material such as $Co_xFe_yB_z$, described above (e.g., $Co_{40}Fe_{40}B_{20}$), or another material having a high magnetic moment density. By way of example, the auxiliary layer 280 may vary in thickness from 0.5 nm to 7.0 nm. According to embodiments, the lower SAF1 layer 222 of the SAF structure 220 may be formed using a high-anisotropy multilayer structure, such as a CoPt multilayer structure. Using a bottom capping auxiliary layer 280 with a high magnetic moment density, such as the arrangement shown in FIG. 2A, may allow for a reduction in the total combined thickness of the lower SAF1 layer 222 and the auxiliary layer 280 if the moment density $M_s$ of the auxiliary layer 280 is greater than the moment density $M_s$ of the lower SAF1 layer 222.

FIG. 2B shows an MTJ stack 200 that includes an auxiliary exchange coupling layer 290 between the auxiliary layer 280 and the lower SAF1 layer 222 of the SAF structure 220. The stack 200 of FIG. 2B is formed such that an auxiliary exchange coupling layer 290 is formed above an auxiliary layer 280 at the bottom of the SAF structure 220. The lower SAF1 layer 222 of the SAF structure 220 is formed above the auxiliary exchange coupling layer 290. In this configuration, the auxiliary layer 280 also forms a bottom capping layer at the bottom of the SAF structure 220. The auxiliary exchange coupling layer 290 helps couple the lower SAF1 layer 222 and the auxiliary bottom capping layer 280 in FIG. 2B in a way that helps facilitate the reduction of stray fields in the MTJ stack 200. Use of an auxiliary exchange coupling layer 290 allows for additional control and tuning of the interaction between the auxiliary layer 280 and the lower SAF1 layer 222. The auxiliary exchange coupling layer 290 may be made from materials containing ferromagnetic elements, such as Fe, Co, or Ni, or alloys of those elements. The auxiliary exchange coupling layer 290 may also include other elements such as Ta, Cr, W, Ti, and Ru. The auxiliary exchange coupling layer 290 may have a thickness in the range from 0.3 nm to 1.0 nm. Using an auxiliary exchange coupling layer 290 may also facilitate growth of the lower SAF layer 222 with the proper crystalline structure. Other components of FIG. 2B are similar to those described in connection with FIG. 2A.

Other configurations of MTJ stacks with auxiliary layers are possible. For example, FIG. 3A shows an auxiliary layer 380 deposited over the lower SAF1 layer 322 of the SAF structure 320 in a top capping layer arrangement. The MTJ stack 300 of FIG. 3A is similar to the stack 200 of FIG. 2 with like elements numbered similarly. The principal difference is that the auxiliary layer 380 is deposited over the lower SAF1 layer 322 of the SAF structure 320 rather than below it such that it forms a top capping layer. This top capping auxiliary layer 380 can be made from similar materials as those discussed for the bottom capping auxiliary layer 280 in FIG. 2. Using a top capping auxiliary layer 380 can have some advantages, including the improved proximity to the free layer 336 and the filter layer 350. This improved proximity can contribute to more efficient flux compensation for these layers, which reduces the asymmetry of the free layer and the loop asymmetry of the filter layer 350, which may be a polarizer layer or a precessional spin current magnetic layer. According to embodiments, the top capping auxiliary layer 380 can be made from similar materials as the bottom capping auxiliary layer 280 of FIG. 2. For example, the top capping auxiliary layer 390 may also be made from a material with a high magnetic moment density, including but not limited to $Co_xFe_yB_z$ (e.g., $Co_{40}Fe_{40}B_{20}$), for example. Additionally, the top capping auxiliary layer 380 can be made with a thickness that is the same (or within the same range) as the bottom capping auxiliary layer 280 discussed in connection with FIG. 2. According to embodiments, the top capping auxiliary layer 380 may be made thinner than the bottom capping auxiliary layer 280 shown in FIG. 2, because of its proximity to the free layer 336 and the filter layer 350.

FIGS. 3B, 3C, and 3D all show different arrangements of the MTJ stack 300 shown in FIG. 3A, using various auxiliary exchange coupling layers in different locations. FIG. 3B, for example, shows that an auxiliary exchange coupling layer 390 can be deposited between the top capping auxiliary layer 380 and the lower SAF1 layer 322 of the SAF structure 320. The auxiliary exchange coupling layer 390 may be made from similar material as the auxiliary exchange coupling layer 290 shown in FIG. 2B, and may have a similar thickness to that auxiliary exchange coupling layer 290. The auxiliary exchange coupling layer 390 can be used to increase the coupling of between the top capping auxiliary layer 380 and other layers of the MTJ stack 300, in particular, the coupling with the layer 326. This coupling may be further enhanced by layer 394 if used. According to an embodiment, the auxiliary exchange coupling layer 390 is used in connection with a top capping auxiliary layer that has a high magnetic moment density.

In FIG. 3C, the MTJ stack 300 uses two separate auxiliary exchange coupling layers 390, 392. The first auxiliary exchange coupling layer 390 is deposited between the top capping auxiliary layer 380 and the lower SAF1 layer 322 of the SAF structure 320, as in FIG. 3B. The second auxiliary exchange coupling layer 392 is deposited above the top capping auxiliary layer 380. Using the two auxiliary exchange coupling layers 390, 392 in the configuration of FIG. 3C can increase the antiferromagnetic coupling between the lower SAF1 layer 322 and the upper SAF2 layer 326 of the SAF structure 320. Additionally, according to an embodiment, the material of the two auxiliary exchange coupling layers 390 and 392 of FIG. 3C can also be selected to facilitate growth of other layers of the stack 300 deposited on them, such as the auxiliary layer 380 or the antiferromagnetic coupling layer 324. The second auxiliary exchange coupling layer 392 can be formed, for example, using Co or Co-rich alloys. When such materials are used, the second auxiliary exchange coupling layer 392 can have a thickness in the range from 0.3 nm to 1 nm.

As shown in FIG. 3D, the MTJ stack 300 may also be used with three auxiliary exchange coupling layers 390, 392, 394. As in FIG. 3C, the first auxiliary exchange coupling layer 390 is deposited between the top capping auxiliary layer 380 and the lower SAF1 layer 322 of the SAF structure 320 and the second auxiliary exchange coupling layer 392 is deposited above the top capping auxiliary layer 380. In FIG. 3D, a third auxiliary exchange coupling layer 394 is deposited above the antiferromagnetic coupling layer 324 and below the upper SAF2 layer 326 of the SAF structure 320. The first and second auxiliary exchange coupling layers 390 and 392 may be formed as discussed above in connection with FIGS. 3B, 3C, and previous figures. The third auxiliary exchange coupling layer 394 can be formed, for example, using Co or Co-rich alloys. When such materials are used, the third auxiliary exchange coupling layer 394 can have a thickness that ranges from 0.3 nm to 1 nm. The third auxiliary exchange coupling layer 394 may be optionally used in the MTJ stack 300 to further increase antiferromagnetic coupling of the SAF structure 320. The third auxiliary exchange coupling layer 394 may also be used to facilitate growth of the upper SAF2 layer 326. Additional auxiliary exchange coupling layers can optionally be added to the MTJ stack 300 to help increase antiferromagnetic coupling, to allow more precise magnetic tuning and control of the stray magnetic fields, and to facilitate growth of layers within the stack 300.

An auxiliary layer may also be added to the stack in different configurations. For example, in FIG. 4A, an MTJ stack 400 is shown that has layers similar to the MTJ stacks 200, 300 described in connection with FIGS. 2 and 3. The MTJ stack 400 of FIG. 4 also includes an auxiliary layer 480. The auxiliary layer 480 of FIG. 4 is inserted in the middle of the lower SAF1 layer 422 of the SAF structure 420. Thus, the auxiliary layer 480 of FIG. 4 is deposited above the bottom portion 422b but above the top portion 422a of the lower SAF1 layer 422 of the SAF structure 420. In other words, in forming the MTJ stack 400, the bottom portion 422b of the lower SAF1 layer 422 is deposited and then the auxiliary layer 480 is deposited over the bottom portion 422b of the lower SAF1 layer 422. The top portion 422a of the lower SAF1 layer 422 of the SAF structure 420 is deposited over the auxiliary layer 480. In this configuration, the auxiliary layer 480 forms a mid-capping layer. According to an embodiment, the auxiliary layer 480 is made from similar material to the other auxiliary layers 280, 380 discussed above. For example, the auxiliary layer 480 can be made from material that has a high magnetic moment density, such as $Co_xFe_yB_z$ (e.g., $Co_{40}Fe_{40}B_{20}$), for example. The auxiliary layer 480 also may have a similar thickness to the other auxiliary layers 280, 380 discussed above. For example, according to an embodiment, the auxiliary layer may have a thickness that ranges from 0.5 nm to 7.0 nm According to an embodiment, the top portion 422a and the bottom portion 422b of the lower SAF1 layer 422 may have a combined thickness that is equivalent to the lower SAF1 layer 222, 322 described above in connection with FIGS. 2, 3. For example, the top portion 422a and the bottom portion 422b of the lower SAF1 layer 422 may have a combined thickness of 2 nm to 20 nm (e.g., 6 nm). The distribution of the thickness between the top portion 422a and the bottom portion 422b may vary, however, depending upon a number of factors, including the desired operation of the MTJ stack. For example, in a situation where the lower SAF1 layer 422 of the SAF structure 420 would normally be 6 nm, the total 6 nm thickness can be distributed over the top portion 422a and the bottom portion 422b in different ways, depending on a number of factors, including the desired operation of the stack. According to an embodiment, the 6 nm thickness of the lower SAF1 layer 422 of the SAF structure 420 can be evenly divided so that the top portion 422a and the bottom portion 422b each have a thickness of 3 nm. According to another embodiment, the 6 nm thickness of the lower SAF1 layer 422 of the SAF structure 420 can be divided unequally. For example, the top portion 422a may have a thickness of about 4 nm, while the bottom portion 422b may have a thickness of about 2 nm. According to an embodiment, the top portion 422a may have a thickness that ranges from 1 nm to 5 nm, while the bottom portion 422b may have a thickness that ranges from 1 nm to 20 nm. The thicknesses of the top portion 422a and the bottom portion 422b may be chosen based upon the desired performance and characteristics of the SAF structure 420 and the MTJ stack 400 generally.

The MTJ stack 400 may optionally include one or more auxiliary exchange coupling layers, as shown in FIG. 4B. For example, the MTJ stack 400 may be formed with one or more auxiliary exchange coupling layers 490, 492 between the mid-capping auxiliary layer 480 and one or more of the top portion 422a or the bottom portion 422b of the lower SAF1 layer 422 of the SAF structure 420. As with other auxiliary exchange coupling layers described above, such auxiliary exchange coupling layers 490, 492 may improve antiferromagnetic coupling within the SAF structure 420. Additionally, optional auxiliary exchange coupling layers 490, 492 may also facilitate growth of other layers in the MTJ stack 400, such as the auxiliary layer 480 or the any layers of the SAF structure 420. More auxiliary exchange coupling layers can be used to achieve different performance characteristics or objectives consistent with the principles described herein.

Using the teachings herein, MTJ stacks may be made using different combinations of the elements described in this patent document. For example, an MTJ stack may incorporate a number of auxiliary layers, including one or more of a bottom capping auxiliary layer, a top-capping auxiliary layer, or a mid-capping auxiliary layer. FIG. 5 shows one arrangement where an MTJ stack 500 uses multiple auxiliary layers 580, 582 to reduce stray magnetic fields. In the MTJ stack 500 shown in FIG. 5, for example, a first auxiliary layer 580 is deposited below the lower SAF1 layer 522 of the SAF structure 520. This first auxiliary layer 580 acts as a bottom capping layer, and may be made similarly to the bottom capping auxiliary layer 280 shown in FIG. 2 and described in connection therewith. A second auxiliary layer 582 is deposited over the lower SAF1 layer 522 of the SAF structure 520. The second auxiliary layer 582 acts as a top-capping layer, and may be made similarly to the top-capping layer 380 shown in FIG. 3 and described in connection therewith. Although not shown in FIG. 5, the MTJ stack 500 may further include additional auxiliary layers, or one or more auxiliary exchange coupling layers to increase antiferromagnetic coupling and to facilitate growth of different layers of the stack. The auxiliary exchange coupling layers may be above or below the auxiliary layers 580, 582 shown in FIG. 5 or at other locations within the stack. Any auxiliary exchange coupling layers used in the MTJ stack 500 device can be formed similarly to any of the auxiliary exchange coupling layers described above, both in terms of materials used and the dimensions of the device.

Other arrangements of MTJ stacks can be used to reduce stray magnetic fields and their effects on layers in the stack, such as the free layer or the filter layer, where such a layer is used. Stray magnetic fields can negatively impact the free layer, for example, even when the total magnetic moment of the free layer 136 and of the upper SAF2 layer of the SAF structure is equal to the total magnetic moment of the lower SAF1 layer. This situation is sometimes referred to as the "moment-balanced" case. The stray magnetic fields can be reduced by creating an imbalance in the total moment above and below the antiferromagnetic coupling layer of the SAF structure. This is what the auxiliary layers described in connection with FIGS. 2-5 above accomplish. Such an imbalance to help reduce or eliminate unwanted stray magnetic fields and their negative effects on layers of an MTJ stack can be created in other ways, such as by changing the properties of the various layers of the SAF structure.

FIG. 6, for example, shows an MTJ stack 600 that is similar in many ways to the MTJ stack 100 of FIG. 1B, except that changes in the SAF structure 620 create an imbalance in the magnetic moment above and below the antiferromagnetic coupling layer 624 to reduce unwanted stray magnetic fields. In particular, the MTJ stack 600 of FIG. 6 includes a SAF structure 620 with an antiferromagnetic coupling layer 624 between a lower SAF1 layer 622 and an upper SAF2 layer 626, similar to the other MTJ stacks described herein. As previously discussed, the SAF layers 622, 626, may be made from a variety of materials, including Co, Ni, Fe, alloys of those elements, alloys of magnetic elements with non-magnetic elements, such as B, Ta, W, Pt, and Pd, or using multiple layers of magnetic elements or alloys and non-magnetic elements such as Pt and Pd. Examples of multiple-layer constructions of the SAF layers 622, 626 can include, for example, CoPt or CoPd multi-layer structures. Also as previously discussed, the antiferromagnetic coupling layer 624 can be made from materials such as Ru or Cr, or other materials suitable to induce anti-parallel alignment between the lower SAF1 layer 622 and the upper SAF2 layer 626.

According to an embodiment, unwanted stray fields on layers of the MTJ stack 600 can be reduced by using a SAF structure 620 in the stack that has SAF layers with substantially the same magnetic-moment density, but has a lower SAF1 layer 622 that is larger (i.e. thicker) than the upper SAF2 layer 624, as shown in FIG. 6. Thus, while the SAF layers 622, 626 can normally have a thickness in the range of 2 nm to 20 nm (e.g., 6 nm), in the configuration shown in FIG. 6, the lower SAF1 layer 622 is relatively thicker than the upper SAF2 layer 626. In an embodiment, the lower SAF1 layer 622 may have a thickness that is in the range of two to four times the thickness of the upper SAF2 layer 626. Because the SAF layers 622, 626 have substantially the same magnetic-moment density, the increased thickness of the lower SAF1 layer 622 creates the moment imbalance necessary to reduce unwanted stray magnetic fields. Specifically, the increased thickness of the lower SAF1 layer 622 must be relatively large to compensate for the close proximity of the reference layer 623 and the upper SAF2 layer 626 to the free layer 636 and the filter layer 650. Thus, according to an embodiment, the lower SAF1 layer 622 will require a relatively large increase in the etch depth to manufacture the MTJ stack 600.

Using the configuration of the MTJ stack 600 of FIG. 6 to reduce the unwanted stray magnetic fields permits a manufacturer or designer to use a small number of materials in a relatively small number of layers. In particular, because the magnetic moment density of the two SAF layers 622, 626 should be substantially the same, that may be accomplished by using the same materials for each layer. As such, in situations where a manufacturer or designer desires to reduce stray magnetic fields but also wants to limit the number of different materials used in an MTJ stack, the configuration shown in FIG. 6 may be desirable.

The MTJ stack 700 of FIG. 7 shows another approach to create an imbalance in the magnetic moment above and below the antiferromagnetic coupling layer 724 in such a way to reduce unwanted stray magnetic fields. The MTJ stack 700 of FIG. 7 is similar to the MTJ stack 600 of FIG. 6, but includes a different SAF structure 720. Unlike the SAF structure 620 of the MTJ stack 600 in FIG. 6, the SAF structure 720 of the MTJ stack 700 in FIG. 7 has two SAF layers 722, 726 that have substantially the same thickness. But to create a magnetic moment imbalance to help reduce stray magnetic fields to other layers of the stack, the magnetic moment densities of the two SAF layers 722, 726 are different. In particular, the magnetic moment density of the lower SAF1 layer 722 is larger than the magnetic moment density of the upper SAF2 layer 726. Thus, the relatively larger magnetic moment density of the lower SAF1 layer 722 is able to compensate for the effects of the upper SAF2 layer 726 and the reference layer 732 on other layers of the stack 700, such as the free layer 736 and the filter layer 750, even though the upper SAF2 layer 726 and reference layer 732 are in closer proximity with those layers.

By way of example, the lower SAF1 layer 722 of FIG. 7 can be manufactured with relatively large moment density by using CoPt multilayers where the Co layer thickness is increased, or where the Pt thickness is decreased, or by using alloys that contain high-moment density materials including Co, Fe, or Ni. A multilayer lower SAF1 layer 722 can be manufactured using several different useful configurations. To explain the some of the useful configurations, $Co_aPt_b$, is used to represent a multilayer where the thickness of the Co layer(s) is a and the thickness of the Pt layer(s) is b, and $Co_APt_B$ is used to represent a multilayer where the thickness of the Co layer(s) is A and the thickness of the Pt layer(s) is B, where A>a and B>b. Using this nomenclature, several examples of combinations that can be used with embodiments described herein, are described in table 1 below:

TABLE 1

| SAF1 | SAF2 |
|---|---|
| $Co_APt_b$ | $Co_aPt_b$ |
| $Co_aPt_b$ | $Co_aPt_B$ |
| $Co_APt_b$ | $Co_aPt_B$ |

The combinations shown above in Table 1 are examples, and other thickness combinations are also possible and may be used with embodiments described herein (e.g., SAF1: $Co_aPt_b$, SAF2: $Co_APt_B$), depending on the details of the growth conditions of the layers, as will be understood from the principles described herein.

At the same time, the upper SAF2 layer can be manufactured with a relatively low moment density by using a CoPt multilayer with thin Co layers and relatively thick Pt layers. In this way an embodiment may have a moment density $\mu_0M_s$ of about 0.2 to 0.3 Tesla in the upper SAF2 layer 726, while the moment density $\mu_0 M_s$ of the lower SAF1 layer 722 is in the range of about 0.5 to 0.8 Tesla, where $\mu_0 = 4\pi \times 10^{-7}$.

As can be appreciated from the foregoing description, the principles discussed in connection with FIGS. 6 and 7 can be used and adapted consistent with the principles described herein to create other MTJ stack designs. For example, by using a large contrast between the magnetic moment density of the lower SAF1 layer 722 and of the upper SAF2 layer 726 with the magnetic moment density of the lower SAF1 layer 722 being much larger than the magnetic moment density of the upper SAF2 layer 726, the lower SAF1 layer 722 can be thinner than the upper SAF2 layer 726. The arrangements discussed in connection with FIGS. 6 and 7 are advantageous when it is desirable to reduce or minimize the number of magnetic materials or magnetic layers. According to an embodiment, the SAF structures 620, 720 in the MTJ stacks 600, 700 of FIGS. 6 and 7 generally also have high magnetic stability via the anti-ferromagnetic coupling through the antiferromagnetic coupling layers 624, 724. According to an embodiment, the SAF layers also are compatible with the magnetic texture and growth requirements of the other layers of the MTJ stack 600, 700.

Figure 8B:
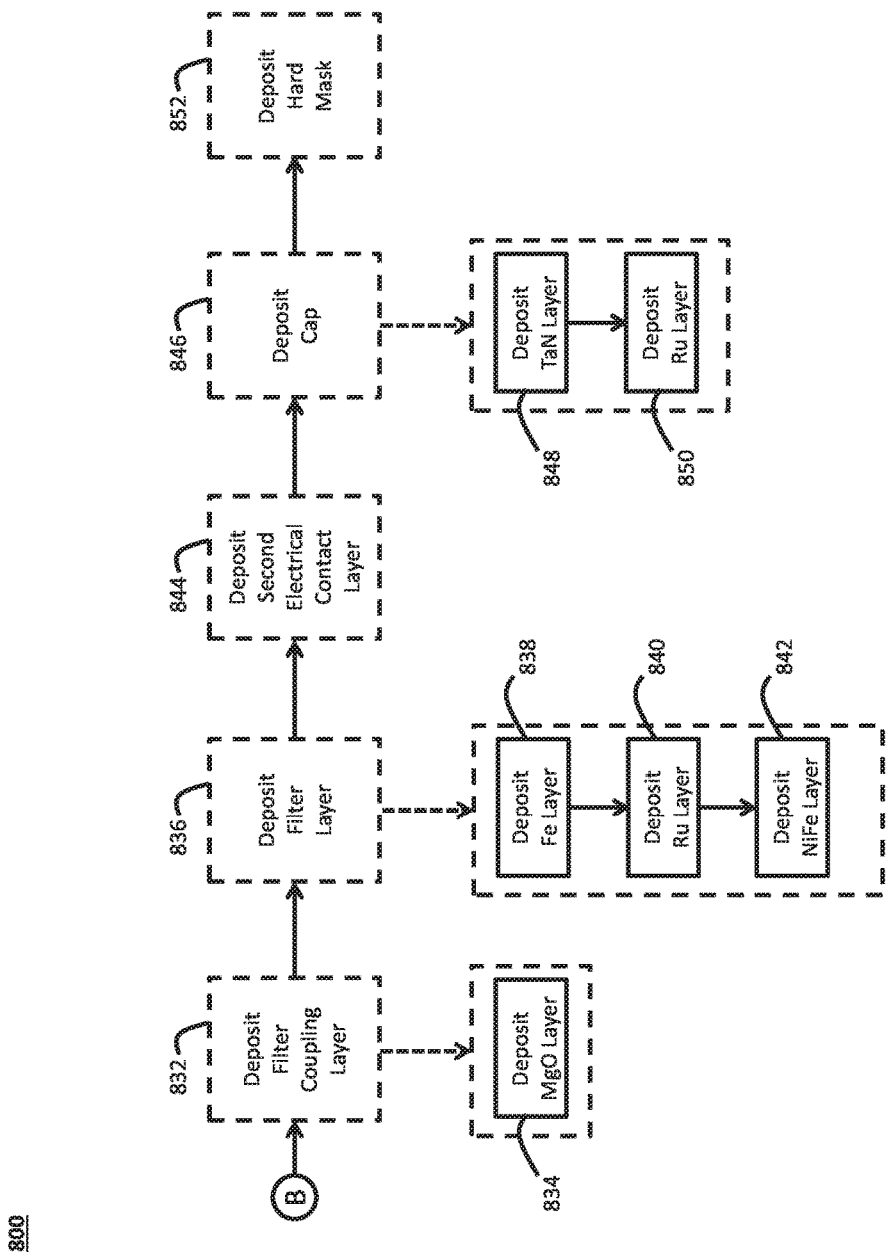

A flowchart showing a method 800 of manufacturing an embodiment of an MRAM stack, according to an embodiment, is illustrated in FIGS. 8A-8B. The method 800 shown in FIG. 8 can be used to manufacture the MRAM stacks 200, 300, 400, 500, 600, 700 described in connection with FIGS. 2-7. Accordingly, to the extent that reference is made to MRAM stacks and the layers thereof, it is meant to be inclusive of the MTJ stacks 200, 300, 400, 500, 600, 700 of those figures and the other MTJ stacks described herein, and is not intended to be exclusive, even if reference is made to only one or a subset of the MTJ stacks in those figures.

The method 800 shown in FIG. 8 details how the MRAM stack is formed on a substrate, which in an embodiment can be a silicon substrate and in other embodiments can be any other appropriate substrate material. Optionally, at optional step 802, an optional first electrical contact layer 270, 370, 470, 570, 670, 770 may be deposited. The first electrical contact layer is made from electrically conductive material, such as Cu, Au, or another suitable conductor, and may be used as a bottom electrode to apply a voltage across the MTJ stack.

In step 804 seed layer 210, 310, 410, 510, 610, 710 is deposited. In an embodiment, the seed layer can be constructed by depositing, at step 806, a TaN layer and then, at step 808, depositing a Ni layer, which together form the seed layer. In an embodiment, the TaN layer is a thin film having a thickness of 5 nm and the Ni layer is a thin film having a thickness of 5 nm. In alternative embodiments, the TaN layer can have a thickness ranging from 2 nm to 20 nm while Ni layer can have a thickness ranging from 0 nm to 20 nm. According to an embodiment, the Ni layer can be replaced by a Cu layer or a layer made of other suitable materials.

At step 810, an SAF structure 220, 320, 420, 520, 620, 720 is deposited. As described herein, the SAF structure is a multi-layer structure that generally includes two or more thin magnetic layers having opposite or anti-parallel magnetization directions, which are separated by an antiferromagnetic coupling layer or spacer layer that is not magnetic. According to embodiments, the SAF structure is created in such a way to reduce stray magnetic fields by creating an imbalance in the total magnetic moment above and below the antiferromagnetic coupling layer. As described herein, that imbalance can be created by adding auxiliary layers to the stack, or by adjusting the thickness and magnetic moment density of one or more layers of the SAF structure.

Figure 9:
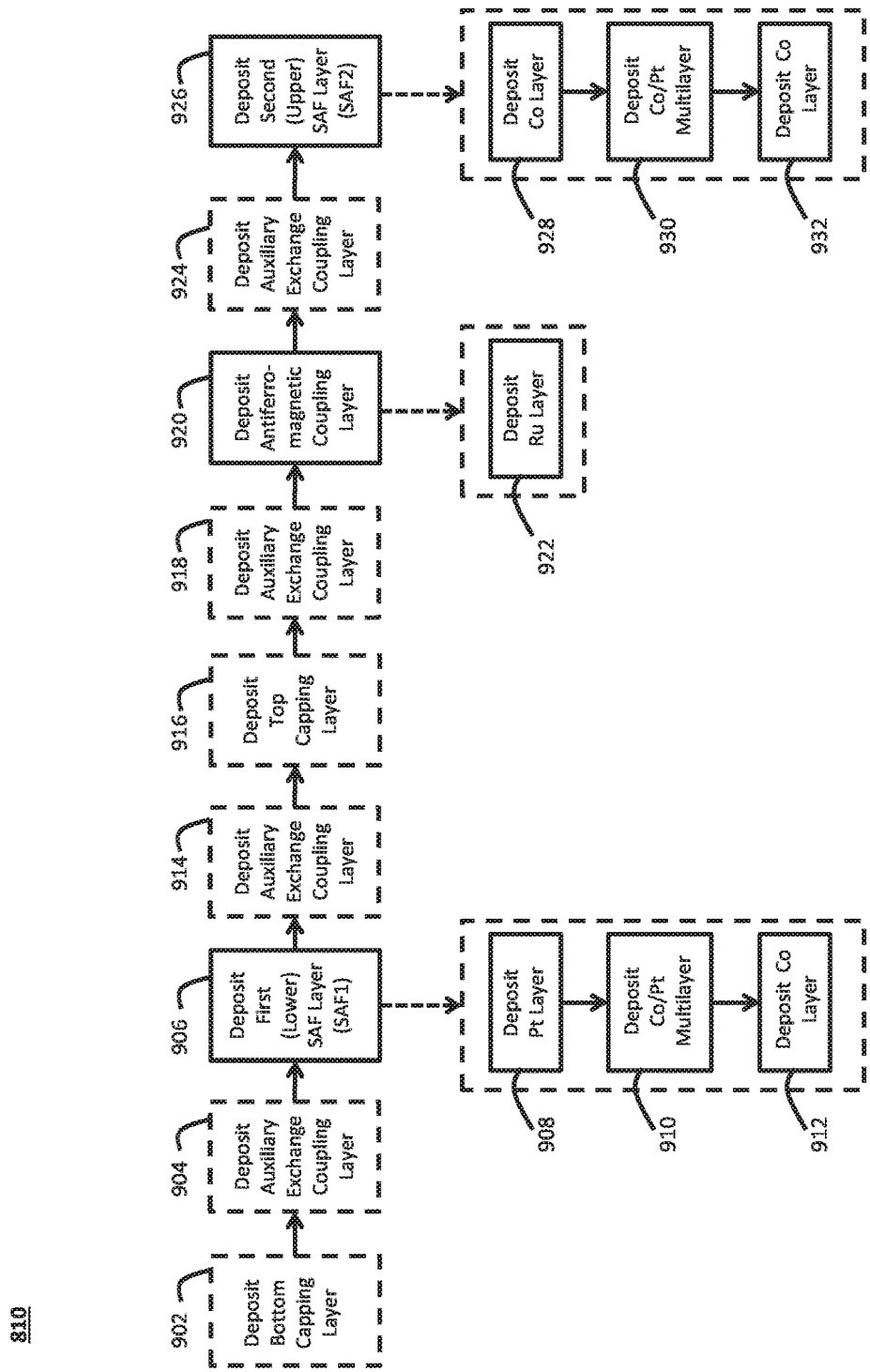
FIG. 9 illustrates a flow chart showing manufacturing steps for an SAF structure used with an MRAM device.

The method of forming the SAF structure includes the deposition of multiple layers in multiple steps as further described in connection with FIG. 9, which shows the detailed sub-steps of step 810. As shown in FIG. 9, the formation of the SAF structure 220, 320, 420, 520, 620, 720 can proceed in a number of different ways that include different optional steps that can be mixed or matched consistent with the structures and principles described herein. In optional step 902, an optional bottom capping layer may be deposited at the bottom portion of the SAF structure. The bottom capping layer is an auxiliary layer that can be added to the MTJ stack to help reduce stray magnetic fields. Examples of auxiliary layers that form bottom capping layers 280, 580 at the bottom of the SAF structure 220, 520 are shown in FIGS. 2A, 2B, and 5. Auxiliary layers, such as an auxiliary layer deposited in step 902 for use as a bottom capping letter are formed from material having a high magnetic moment density, such as $Co_xFe_yB_z$ (e.g., $Co_{40}Fe_{40}B_{20}$), or other suitable material. In an embodiment, the auxiliary layer deposited as a bottom capping layer in step 902 has a thickness within the range from 0.5 nm to 7.0 nm. The bottom capping layer may be formed directly on the seed layer 210, 510, and is either in direct contact with the lower SAF1 layer of the SAF structure or is in contact with an auxiliary exchange coupling layer, if an auxiliary exchange coupling layer is deposited over the bottom capping layer in optional step 904.

In optional step 904, an optional auxiliary exchange coupling layer may be deposited over a bottom capping layer. An example of such an optional auxiliary exchange coupling layer 290 deposited over a bottom capping layer 280 is shown in FIG. 2B, but such an auxiliary exchange coupling layer can be used any time an auxiliary layer is deposited in optional step 902 as a bottom capping layer. An optional auxiliary exchange coupling layer deposited in optional step 904 can be formed from a number of different materials. For example, such an auxiliary exchange coupling layer may contain ferromagnetic elements such as Fe, Co, and Ni, or alloys of those elements. Additionally, the auxiliary exchange coupling layer may include other elements or alloys of other elements, such as Ta, Cr, W, Ti, and Ru. The optional auxiliary exchange coupling layer that may be deposited in optional step 904 can have a thickness between 0.3 nm to 1 nm. When an auxiliary exchange coupling layer is deposited over a bottom capping layer in optional step 904, then the first SAF layer, or the lower SAF1 layer of the SAF structure is deposited over the auxiliary exchange coupling layer deposited in step 904.

In step 906, a first SAF layer 222, 322, 422, 522, 622, 722, which is also referred to as SAF1 or the "lower" SAF layer, is deposited. In an embodiment, the first SAF layer deposited in step 906 can comprise multiple different layers deposited in multiple steps or sub-steps. For example, a Pt layer can be deposited at step 908, a Co/Pt multilayer can be deposited at step 910, and a Co layer can be deposited at step 912, as shown in FIG. 9. In an embodiment, the Pt layer deposited in step 908 is a Pt thin film having a thickness of 0.7 nm. In other embodiments, Pt layer deposited in step 908 can comprise a Pt thin film having a thickness ranging from 0.5 nm to 20 nm. The Co/Pt multilayer deposited in step 910 can comprise a thin film of Co having a thickness of 0.6 nm and a thin film of Pt having a thickness of 0.4 nm. In other embodiments, the Co layer of the Co/Pt multilayer deposited in step 910 can have a thickness of 0.1 nm to 1 nm and the Pt layer of the Co/Pt multilayer deposited in step 910 can have a thickness ranging from 0.1 nm to 1 nm. In an embodiment, the Co/Pt multilayer deposited in step 910 is repeated such that the Co/Pt multilayer comprises six Co/Pt multilayers. In an embodiment, the Co layer deposited in step 912 is a thin film having a thickness of 0.6 nm. In other embodiments, the Co layer deposited in step 912 can have a thickness ranging from 0.1 nm to 1.0 nm.

In addition, as described in connection with FIGS. 4A, 4B, the deposition of the first SAF layer can be broken into a top portion and a bottom portion. An auxiliary layer may optionally be deposited over the bottom portion of the first SAF layer and the top portion of that first SAF layer may be deposited over the auxiliary layer (see FIG. 4A). Optionally, auxiliary exchange coupling layers may also be deposited before and after the deposition of the first SAF layer (see FIG. 4B). In configurations where an auxiliary layer is deposited after the bottom portion of the first SAF layer is deposited but before the top portion of that first SAF layer is deposited, the auxiliary layer forms a mid-capping layer. When the deposition of the first SAF layer (SAF1) is divided into a bottom portion and a top portion, each of those portions may include the materials deposited in steps 908, 910, and 912, which may be repeated for each portion of the first SAF layer. Each of the possibilities of breaking up the first SAF layer into portions with or without auxiliary exchange coupling layers have not been shown in FIG. 9 to avoid unnecessarily obscuring the flow diagram of that figure, but examples have been described in connection FIG. 4. Auxiliary layers used as mid-capping layers within the first SAF layer use similar materials and have similar thicknesses to the auxiliary layers used as bottom capping layers. Likewise, to the extent that one or more auxiliary exchange coupling layers is deposited within the first SAF layer in step 906, those layers may be formed from similar materials as the auxiliary exchange coupling layer discussed in connection with optional step 904 and may have similar thicknesses as those auxiliary exchange coupling layers as well.

The first SAF layer has a magnetic vector with a direction perpendicular to its plane. The magnetic direction of first SAF layer is fixed and will not change directions under normal operating conditions. The thickness of the layers are selected, according to one embodiment, to have high anisotropy while managing stray magnetic fields.

After the first SAF layer, or lower SAF layer (SAF1), is deposited, an optional auxiliary layer may be deposited (either with or without one or more auxiliary exchange coupling layers) to function as a top capping layer. For example, in optional step 914, an auxiliary exchange coupling layer similar to the layer discussed in connection with optional step 904 may be deposited over the first SAF layer (SAF1). Examples of such auxiliary exchange coupling layers 390 deposited over the first SAF layer 322 can be seen in and are described in connection with FIGS. 3B, 3C, 3D.

In optional step 916, an optional auxiliary layer may be deposited either directly over the first SAF layer, if following step 906, or over an auxiliary exchange coupling layer, if following optional step 914, as a top capping layer. The auxiliary layer deposited in optional step 916 as a top capping layer uses similar materials with similar thicknesses to the auxiliary layers used as bottom capping layers, discussed in connection with optional step 902. Examples of auxiliary layers used as top capping layers 380, 582 can be seen in and are described in connection with FIGS. 3A-3D, 5. Examples of auxiliary layers 380, 582 deposited directly on the first SAF layer (SAF1) 322, 522 as top capping layers, according to an embodiment, can be seen in and are described in connection with FIGS. 3A, 5. Examples of auxiliary layers 380 deposited as top capping layers on an auxiliary exchange coupling layer 390 (which is deposited on the first SAF layer), in accordance with an embodiment, can be seen in and are discussed in connection with FIGS. 3B, 3C, 3D.

In optional step 918, an optional auxiliary exchange coupling layer similar to the layer discussed in connection with optional step 904 may be deposited over the auxiliary layer deposited in step 916 as a top capping layer. Examples of such auxiliary exchange coupling layers 392 deposited over an auxiliary layer used as a top capping layer 380 can be seen in and are described in connection with FIGS. 3C, 3D. In embodiments, the auxiliary exchange coupling layer deposited in optional step 918 can be formed from Co or Cobalt-rich alloys and can be between 0.3 nm to 1.0 nm thick.

In step 920, an antiferromagnetic coupling layer 224, 324, 424, 524, 624, 724 is deposited. The antiferromagnetic layer is non-magnetic and are intended to induce anti-parallel alignment between the lower and upper SAF layers. In an embodiment, the antiferromagnetic coupling layer deposited in step 920 comprises a Ru thin film having a thickness of 0.8 nm, and in other embodiments can range from 0.3 nm to 1.5 nm. The antiferromagnetic coupling layer may also be made from other materials, such as Cr or other materials suitable to induce anti-parallel alignment between the first SAF layer (SAF1) deposited in step 906 and the second SAF layer (SAF2) to be deposited in step 926.

In optional step 924, an optional auxiliary exchange coupling layer similar to the layer discussed in connection with optional step 918 may be deposited over the antiferromagnetic coupling layer deposited in step 920. An example of such an auxiliary exchange coupling layer 394 deposited over an antiferromagnetic coupling layer 324 can be seen in and is described in connection with FIG. 3D.

At step 926, a second layer 226, 326, 426, 526, 626, 726, which is also referred to as SAF2 or the "upper" SAF layer. Fabrication of the second SAF layer in step 926 involves multiple steps. For example, at step 928, a Co layer is deposited. In an embodiment, the Co layer deposited in step 928 is a thin film having a thickness of 0.3 nm and in other embodiments, can have a thickness of 0.1 nm to 1.0 nm. In step 930, a Co/Pt multilayer is deposited. In an embodiment, the Co/Pt multilayer deposited in step 930 comprises a thin film of Co having a thickness of 0.6 nm and a thin film of Pt having a thickness of 0.4 nm. In other embodiments, the thin film of Co can have a thickness of 0.1 nm to 1.0 nm while the thin film of Pt can have a thickness of 0.1 nm to 1.0 nm. Moreover, the Co/Pt multilayer deposited in step 930 can comprise multiple Co/Pt layers as described herein. In an embodiment, the Co/Pt multilayer deposited in step 930 has two Co/Pt multilayers with the thickness properties described above. After depositing Co/Pt multilayer at step 930, the method described herein deposits a cobalt layer at step 932. In an embodiment, the Co layer deposited in step 932 is a thin film having a thickness of 0.6 nm, while other embodiments, Co layer deposited in step 932 can have a thickness in the range of 0.1 nm to 1.0 nm. Together, the Co layer deposited in step 928, the Co/Pt layer deposited in step 930 and the Co layer deposited in step 932 form a magnetic structure. The magnetic direction of the combination of these three layers deposited in steps 928, 930, and 932 is fixed, perpendicular to the plane of each layer, and antiparallel to the magnetic direction of first, lower SAF layer (SAF1). The magnetic properties of the combination of Co layer the Co/Pt layer, and the Co layer 518 deposited in steps 928, 930, and 932 will interact with the magnetic properties of reference layer deposited in step 814 of FIG. 8A to generate a magnetic vector having a fixed magnetic direction that is also perpendicular to the plane of each layer of the second SAF layer (SAF2) (although variations of a several degrees are within the scope of what is considered perpendicular) and antiparallel to the magnetic direction of first SAF layer (SAF1).

After deposition of the SAF structure in step 810 (the details of which are described in connection with FIG. 9), a magnetic tunnel junction ("MTJ") 230, 330, 430, 530, 630, 730 is deposited over the SAF structure in step 812. The MTJ includes multiple layers and is deposited in several steps, as shown in FIG. 8. Although not shown in FIG. 8, an optional auxiliary exchange coupling layer may also be deposited between deposition of the SAF structure and the MTJ to couple the SAF structure to the MTJ. For example, in an embodiment, a ferromagnetic coupling layer comprising a thin film of Ta having a thickness of 0.2 nm may be deposited above the SAF before the deposition of the MTJ layers. In other embodiments, a ferromagnetic coupling layer between the SAF structure and the MTJ can be a thin film of Ta, W, Hf or Mo (or other appropriate material) having a thickness ranging from 0.1 nm to 1.0 nm.

As part of the manufacture of the MTJ (step 812), in step 814, a reference layer 232, 332, 432, 532, 632 is deposited. According to an embodiment, fabricating the reference layer includes several steps, including deposition of magnetic layer in step 816, deposition of a tungsten (W) layer in step 818, and deposition of another magnetic layer in step 820. In an embodiment, the magnetic layer deposited in step 816 comprises a thin film of CoFeB having a thickness of 0.6 nm, where the alloy is sixty (60) percent Fe, twenty (20) percent Co and twenty (20) percent B. In an embodiment, the W layer deposited in step 818 comprises a thin film of W having a thickness of 0.2 nm. In an embodiment, the magnetic layer deposited in step 820 comprises a thin film of CoFeB having a thickness of 0.8 nm, where the alloy is sixty (60) percent Fe, twenty (20) percent Co and twenty (20) percent B. In other embodiments, the magnetic layer deposited in step 816 can comprise a thin film of CoFeB having a thickness ranging from 0.5 nm to 1.0 nm, the W layer deposited in step 818 can comprise a thin film having a thickness of 0.1 nm to 1.0 nm, and the magnetic layer deposited in step 820 can comprise a thin film of CoFeB having a thickness of 0.5 nm to 2.0 nm. The reference layer of the MTJ is constructed using magnetic materials so that it has a magnetic vector having a magnetic direction perpendicular to its plane, is fixed in direction. According to an embodiment, the magnetic direction of the reference layer is antiparallel to the magnetic direction of the lower SAF1 layer of the SAF structure.

As part of the manufacture of the MTJ (step 812), at step 822, non-magnetic tunneling barrier layer 234, 334, 434, 534, 634, 734 is deposited on the reference layer. In an embodiment, the non-magnetic tunneling barrier is formed as a thin film of an insulating material, such as MgO.

The manufacture of the MTJ (step 812) continues at step 824, when a free layer 236, 336, 436, 536, 636, 736 is deposited over the non-magnetic tunneling barrier layer. According to an embodiment, the free layer is made from magnetic materials. Fabrication of free layer includes several steps. At step 826, a magnetic layer is deposited over non-magnetic tunneling barrier layer. In an embodiment, the magnetic layer deposited in step 826 is comprised of a thin film of CoFeB having a thickness of 1.2 nm, where the alloy is sixty (60) percent Fe, twenty (20) percent Co and twenty (20) percent B. In other embodiments, magnetic layer deposited in step 826 can comprise a thin film of CoFeB or other suitable magnetic material having a thickness ranging from 0.5 nm to 2.0 nm. Manufacture of free layer continues at step 828, where a Tungsten (W) layer is deposited over the magnetic layer deposited in step 826. In an embodiment, the W layer comprises a thin film of W having a thickness of 0.2 nm, and in other embodiments can a thickness ranging from 0.1 nm to 1.0 nm. At step 830, manufacture of the free layer continues when a second magnetic layer is deposited over the W layer deposited in step 828. In an embodiment, the second magnetic layer of the free layer deposited in step 830 can comprise a thin film of CoFeB having a thickness of 0.9 nm, where the alloy is sixty (60) percent Fe, twenty (20) percent Co and twenty (20) percent B. In other embodiments, the second magnetic layer deposited in step 830 can comprise a thin film of CoFeB or other suitable magnetic material having a thickness ranging from 0.5 nm to 1.5 nm.

Collectively, the first and second magnetic layers deposited in steps 826 and 830, along with non-magnetic W layer deposited in step 828, form the free layer formed in step 824. The free magnetic layer has a magnetic vector having a magnetic direction substantially perpendicular to its plane. Although the magnetic direction of the free magnetic layer is substantially perpendicular to its plane, it may also include magnetization pointing a few degrees away from the perpendicular axis. The tilted angle of the free layer magnetization can be due to interaction with a filter layer, such as a precessional spin current magnetic layer, described herein, or due to magnetocrystalline anisotropy, and can help switching of the free layer magnetization by improving the initiation of the switching. The magnetic direction of free layer can switch one hundred eighty (180) degrees from one direction to another, antiparallel, direction.

After fabrication of MTJ at step 812, the process 800 continues in FIG. 8B at optional step 832. In certain embodiments, the MTJ and SAF structure may be used with an optional filter layer, such as a polarizer layer or precessional spin current magnetic layer and a filter coupling layer (which may also be referred to as a "spacer"). In such situations the process includes optional step 832, in which a filter coupling layer 240, 340, 440, 540, 640, 740 is deposited over the MTJ. In an embodiment, the spacer deposited in step 832 can comprise a thin film of MgO (as shown in step 834) having a thickness of 0.8 nm. In other embodiments, the spacer can comprise a thin film of MgO having a thickness ranging from 0.5 nm to 1.5 nm. In other embodiments, the spacer can be constructed as described in U.S. patent application Ser. No. 14/866,359, filed Sep. 25, 2015, and entitled "Spin Transfer Torque Structure For MRAM Devices Having A Spin Current Injection Capping Layer." U.S. patent application Ser. No. 14/866,359 is hereby incorporated by reference in its entirety.

After deposition of spacer layer in optional step 832, an optional filter layer 250, 350, 450, 550, 650, 750 can be deposited in optional step 836. As shown in FIG. 8B, the manufacture of filter layer can comprise several steps. At step 838, a magnetic Fe layer is fabricated over the filter coupling layer deposited in optional step 832. In an embodiment, the magnetic Fe layer comprises a thin film of Fe having a thickness of 0.6 nm. In other embodiments, magnetic Fe layer deposited in step 838 can comprise a thin film of Fe having a thickness ranging from 0.5 nm to 2.0 nm. At step 840, a Ru layer is deposited over the magnetic Fe layer. In an embodiment, Ru layer deposited in step 840 can comprise a thin film of Ru having a thickness of 1.5 nm, and in other embodiments can comprise a thin film of Ru having a thickness ranging from 0.4 nm to 5.0 nm. At step 842, a magnetic NiFe layer is deposited. In an embodiment, magnetic NiFe layer comprises eighty (80) percent Ni and twenty (20) percent Fe, and has a thickness of 3.0 nm. In other embodiments, the NiFe layer can have a thickness ranging between 0.5 nm to 7.0 nm. NiFe layer can also comprise multiple layers, such as a thin film of CoFeB and NiFe according to an embodiment, or a NiFe layer in between layers of CoFeB, according to another embodiment.

After manufacture of the filter layer, an optional second electrical contact layer 272, 372, 472, 572, 672, 772 may be deposited in optional step 844. The second electrical contact layer is made from electrically conductive material, such as Cu, Au, or another suitable conductor, and may be used as a top electrode to apply a voltage across the MTJ stack.

A capping layer may optionally be deposited in optional step 846, as an auxiliary layer. Manufacture of such a capping layer can comprise multiple steps, such as depositing a TaN layer in step 848 and depositing Ru layer in step 850. In an embodiment, the TaN layer deposited in step 848 comprises a thin film of TaN having a thickness of 2.0 nm, while in other embodiments, the TaN layer deposited in step 848 can have a thickness ranging from 1.0 nm to 5.0 nm. In an embodiment, the Ru layer deposited in step 850 comprises a thin film of Ru having a thickness of 10 nm, while in other embodiments, the Ru layer deposited in step 850 can have a thickness ranging from 1.0 nm to 20 nm. In other embodiments, the capping layer deposited in step 846 can comprise a layer of Ru (with no TaN) or a layer of MgO. The selection of a particular capping structure is influenced by the particular annealing temperature to be used, among other considerations, because these materials will have different characteristics depending on the annealing temperature.

Finally, in optional step 852, an optional hard mask may be deposited. The optional hard mask can comprise a layer of TaN having a thickness of 7.0 nm, for example. According to an embodiment, a hard mask can be deposited in step 852 to pattern the underlying layers of the MTJ structure 100, using a reactive ion etch (RIE) process. According to embodiments, the thickness of the hard mask layer may be varied as appropriate depending upon the patterning technique and materials used, consistent with the principles described herein.

All of the layers of the MRAM devices 200, 300, 400, 500, 600, and 700 illustrated in FIGS. 2-7 can be formed by a thin film sputter deposition system as would be appreciated by those skilled in such deposition techniques. The thin film sputter deposition system can include the necessary physical vapor deposition (PVD) chambers, each having one or more targets, an oxidation chamber and a sputter etching chamber. Typically, the sputter deposition process involves a sputter gas (e.g., argon, krypton, xenon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stacks 200, 300, 400, 500, 600, and 700 are well-known to those skilled in the art and will not be described in detail herein so as not to unnecessarily obscure aspects of the disclosure herein.

It should be appreciated to one skilled in the art that a plurality of MTJ structures 200, 300, 400, 500, 600, 700 can be manufactured and provided as respective bit cells of an STT-MRAM device. In other words, each MTJ stack 200, 300, 400, 500, 600, 700 can be implemented as a bit cell for a memory array having a plurality of bit cells.

It should be recognized that certain components or elements of the embodiments described above, or in the claims that follow, are numbered to allow ease of reference to them or to help distinguish between them, but order should not be implied from such numbering, unless such order is expressly recited. The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device, comprising:
   a first synthetic antiferromagnetic structure in a first plane having a magnetization vector that is perpendicular to the first plane and having a fixed magnetization direction;
   an antiferromagnetic coupling layer in a second plane and disposed above the first synthetic antiferromagnetic structure;
   a second synthetic antiferromagnetic structure in a third plane and disposed over the antiferromagnetic coupling layer;
   a magnetic reference layer in a fourth plane and disposed over the second synthetic antiferromagnetic structure, the magnetic reference layer having a magnetization vector that is perpendicular to the fourth plane and having a fixed magnetization direction;
   a non-magnetic tunnel barrier layer in a fifth plane and disposed over the magnetic reference layer;
   a free magnetic layer in a sixth plane and disposed over the non-magnetic tunnel barrier layer, the free magnetic layer having a magnetization vector that is perpendicular to the sixth plane and having a magnetization direction that can switch between a first magnetization direction to a second magnetization direction, the magnetic reference layer, the non-magnetic tunnel barrier layer and the free magnetic layer forming a magnetic tunnel junction; and
   an auxiliary layer in a seventh plane that adjusts the magnetic-moment imbalance between the first synthetic antiferromagnetic structure and the magnetic reference layer to reduce stray magnetic fields in the free magnetic layer.

2. The magnetic device of claim 1, further comprising an auxiliary exchange coupling layer in an eighth plane and disposed between the auxiliary layer and the first synthetic antiferromagnetic structure, the auxiliary exchange coupling layer formed from a ferromagnetic material and increasing the ferromagnetic coupling between the auxiliary layer and the first synthetic antiferromagnetic structure.

3. The magnetic device of claim 2, wherein the auxiliary exchange coupling layer is made from material including an element from the group of: Fe, Co, and Ni.

4. The magnetic device of claim 2, wherein the auxiliary exchange coupling layer is made from material including an element from the group of: Ta, Cr, W, Ti, and Ru.

5. The magnetic device of claim 2, wherein the auxiliary exchange coupling layer has a thickness within the range of 0.3 nm to 1.0 nm, inclusive.

6. The magnetic device of claim 2, further comprising:
   a second auxiliary exchange coupling layer in a ninth plane and disposed between the first synthetic antiferromagnetic structure and the second synthetic antiferromagnetic structure, the second auxiliary exchange coupling layer increasing the antiferromagnetic coupling between the first synthetic antiferromagnetic structure and the second synthetic antiferromagnetic structure.

7. The magnetic device of claim 2, further comprising:
a second auxiliary exchange coupling layer in a ninth plane and disposed between the first synthetic antiferromagnetic structure and the second synthetic antiferromagnetic structure, the second auxiliary exchange coupling layer increasing the antiferromagnetic coupling between the first synthetic antiferromagnetic structure and the second synthetic antiferromagnetic structure; and
a third auxiliary exchange coupling layer in a tenth plane and disposed between the second synthetic antiferromagnetic structure and the antiferromagnetic coupling layer, the third auxiliary exchange coupling layer further increasing the antiferromagnetic coupling between the first synthetic antiferromagnetic structure and the second synthetic antiferromagnetic structure.

8. The magnetic device of claim 1, wherein the auxiliary layer is formed from $Co_xFe_yB_z$, where y is in the range 40-60%, z is in the range 18-21%, and x+y+z=100%.

9. The magnetic device of claim 8, wherein the auxiliary layer is $Co_{40}Fe_{40}B_{20}$.

10. The magnetic device of claim 1, wherein the auxiliary layer has a thickness within the range of 0.5 nm to 7.0 nm, inclusive.

11. The magnetic device of claim 1, further comprising:
a filter layer in an eighth plane that is physically separated from the free magnetic layer and coupled to the free magnetic layer by a filter coupling layer that may induce ferromagnetic or antiferromagnetic coupling between the free magnetic layer and the filter layer.

12. The magnetic device of claim 11, wherein the filter layer is selected from the group of: a polarizer layer and a precessional spin current magnetic layer.

13. The magnetic device of claim 11, further comprising:
a first electrode disposed beneath and connected to the first synthetic antiferromagnetic structure; and
a second electrode disposed above the polarizing layer;
wherein electrical current is directed through the filter layer, the filter coupling layer, the free magnetic layer, the non-magnetic tunnel barrier layer, the magnetic reference layer, and the synthetic antiferromagnetic structures.

14. The magnetic device of claim 12, wherein alignment of the electrons of the electrical current is further increased by the filter layer.

15. The magnetic device of claim 1,
wherein the filter layer is a precessional spin current magnetic layer having a magnetization vector with a magnetization component in the eighth plane which can freely rotate in any magnetic direction.

16. The magnetic device of claim 15, further comprising:
a first electrode disposed beneath and connected to the first synthetic antiferromagnetic structure; and
a second electrode disposed above the precessional spin current magnetic layer;
wherein electrical current is directed through the precessional spin current magnetic layer, the antiferromagnetic coupling layer, the free magnetic layer, the non-magnetic tunnel barrier layer, the magnetic reference layer, and the synthetic antiferromagnetic structures wherein electrons of the electrical current are polarized.

17. The magnetic device of claim 16, wherein the magnetization direction of the precessional spin current magnetic layer is free to follow the precession of the magnetization direction of the free magnetic layer in a correlated or anticorrelated way, thereby causing spin transfer torque to assist switching of the magnetization vector of the free magnetic layer.

18. The magnetic device of claim 1, further comprising:
a precessional spin current magnetic layer in an eighth plane that is physically separated from the free magnetic layer and coupled to the free magnetic layer by the antiferromagnetic coupling layer, the precessional spin current magnetic layer having a magnetization vector with a magnetization component in the eighth plane which can freely rotate in any magnetic direction; and
a spin-filter-coupling layer in a ninth plane and disposed between the precessional spin current magnetic layer and the free magnetic layer, the spin-filter-coupling layer coupling the precessional spin current magnetic layer and the free magnetic layer.

19. The magnetic device of claim 1, wherein the auxiliary layer is disposed below the first synthetic antiferromagnetic structure, the auxiliary layer being formed from a material having a high magnetic-moment density.

20. The magnetic device of claim 1, wherein the auxiliary layer is disposed above the first synthetic antiferromagnetic structure and below the antiferromagnetic coupling layer, the auxiliary layer being formed from a material having a high magnetic-moment density.

21. The magnetic device of claim 1, wherein the auxiliary layer is disposed parallel to and within the first synthetic antiferromagnetic structure, the auxiliary layer being formed below a top portion of the first synthetic antiferromagnetic structure and above a bottom portion of the first synthetic antiferromagnetic structure, the auxiliary layer being formed from a material having a high magnetic-moment density.

22. The magnetic device of claim 21, wherein the auxiliary layer has a thickness of 6 nm.

23. The magnetic device of claim 21, wherein the auxiliary layer has a thickness of that is equal to the sum total of the thicknesses of the top portion of the first synthetic antiferromagnetic structure and the bottom portion of the first synthetic antiferromagnetic structure.

24. The magnetic device of claim 21, wherein the top portion of the first synthetic antiferromagnetic structure has a thickness between 1 nm and 5 nm.

25. The magnetic device of claim 21, wherein the top portion of the first synthetic antiferromagnetic structure has a thickness of 3 nm.

26. The magnetic device of claim 21, wherein the top portion of the first synthetic antiferromagnetic structure has a thickness between 1 nm and 20 nm.

27. The magnetic device of claim 21, wherein the bottom portion of the first synthetic antiferromagnetic structure has a thickness of 3 nm.

28. The magnetic device of claim 21, wherein the top portion of the first synthetic antiferromagnetic structure has a thickness equal to the bottom portion of the first synthetic antiferromagnetic structure.

29. The magnetic device of claim 21, wherein the bottom portion of the first synthetic antiferromagnetic structure has a thickness that is twice the thickness of the top portion of the first synthetic antiferromagnetic structure.

30. A magnetic device, comprising:
a first synthetic antiferromagnetic structure in a first plane having a magnetization vector that is perpendicular to the first plane and having a fixed magnetization direction;

an antiferromagnetic coupling layer in a second plane and disposed over the first synthetic antiferromagnetic structure;

a second synthetic antiferromagnetic structure in a third plane and disposed over the antiferromagnetic coupling layer;

a magnetic reference layer in a fourth plane and disposed over the second synthetic antiferromagnetic structure, the magnetic reference layer having a magnetization vector that is perpendicular to the fourth plane and having a fixed magnetization direction;

a non-magnetic tunnel barrier layer in a fifth plane and disposed over the magnetic reference layer; and a free magnetic layer in a sixth plane and disposed over the non-magnetic tunnel barrier layer, the free magnetic layer having a magnetization vector that is perpendicular to the sixth plane and having a magnetization direction that can switch between a first magnetization direction to a second magnetization direction, the magnetic reference layer, the non-magnetic tunnel barrier layer and the free magnetic layer forming a magnetic tunnel junction;

wherein the thickness of the first synthetic antiferromagnetic structure is greater than the thickness of the second synthetic antiferromagnetic structure; and wherein the magnetic-moment density of the first synthetic antiferromagnetic structure is the same as the magnetic-moment density of the second synthetic antiferromagnetic structure.

31. The magnetic device of claim 30, wherein the thickness of the first synthetic antiferromagnetic structure has a thickness within the range of 6 nm to 20 nm, inclusive.

32. The magnetic device of claim 30, wherein the thickness of the first synthetic antiferromagnetic structure has a thickness within the range of 2 nm to 6 nm, inclusive.

33. A magnetic device, comprising:
a first synthetic antiferromagnetic structure in a first plane having a magnetization vector that is perpendicular to the first plane and having a fixed magnetization direction;

an antiferromagnetic coupling layer in a second plane and disposed over the first synthetic antiferromagnetic structure;

a second synthetic antiferromagnetic structure in a third plane and disposed over the antiferromagnetic coupling layer;

a magnetic reference layer in a fourth plane and disposed over the second synthetic antiferromagnetic structure, the magnetic reference layer having a magnetization vector that is perpendicular to the fourth plane and having a fixed magnetization direction;

a non-magnetic tunnel barrier layer in a fifth plane and disposed over the magnetic reference layer; and a free magnetic layer in a sixth plane and disposed over the non-magnetic tunnel barrier layer, the free magnetic layer having a magnetization vector that is perpendicular to the sixth plane and having a magnetization direction that can switch between a first magnetization direction to a second magnetization direction, the magnetic reference layer, the non-magnetic tunnel barrier layer and the free magnetic layer forming a magnetic tunnel junction;

wherein the thickness of the first synthetic antiferromagnetic structure and the thickness of the second synthetic antiferromagnetic structure are the same; and wherein the magnetic-moment density of the first synthetic antiferromagnetic structure is greater than the magnetic-moment density of the second synthetic antiferromagnetic structure.

34. The magnetic device of claim 30, wherein the first synthetic antiferromagnetic structure is made from the same material as the second synthetic antiferromagnetic structure.

* * * * *